United States Patent
Wu et al.

(10) Patent No.: US 12,096,621 B2
(45) Date of Patent: Sep. 17, 2024

(54) MULTI-TYPE HIGH VOLTAGE DEVICES FABRICATION FOR EMBEDDED MEMORY

(71) Applicant: Taiwan Semiconductor Manufacturing Company, Ltd., Hsin-Chu (TW)

(72) Inventors: Wei Cheng Wu, Zhubei (TW); Li-Feng Teng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 150 days.

(21) Appl. No.: 17/680,208

(22) Filed: Feb. 24, 2022

(65) Prior Publication Data

US 2022/0181340 A1   Jun. 9, 2022

Related U.S. Application Data

(62) Division of application No. 16/666,731, filed on Oct. 29, 2019, now Pat. No. 11,264,396.

(Continued)

(51) Int. Cl.
*H10B 41/00* (2023.01)
*G11C 16/04* (2006.01)
(Continued)

(52) U.S. Cl.
CPC ......... *H10B 41/00* (2023.02); *G11C 16/0408* (2013.01); *H01L 29/66825* (2013.01);
(Continued)

(58) Field of Classification Search
None
See application file for complete search history.

(56) References Cited

U.S. PATENT DOCUMENTS 8,242,478 B2   8/2012 Sakamoto
2004/0256658 A1   12/2004 Park et al.
(Continued)

FOREIGN PATENT DOCUMENTS

TW   522471 B   3/2003

OTHER PUBLICATIONS

Non-Final Office Action dated Mar. 8, 2021 for U.S. Appl. No. 16/666,731.
(Continued)

*Primary Examiner* — Sarah K Salerno
(74) *Attorney, Agent, or Firm* — Eschweiler & Potashnik, LLC

(57) ABSTRACT

Various embodiments of the present application are directed to an IC device and associated forming methods. In some embodiments, a memory region and a logic region are integrated in a substrate. A memory cell structure is disposed on the memory region. A plurality of logic devices disposed on a plurality of logic sub-regions of the logic region. A first logic device is disposed on a first upper surface of a first logic sub-region. A second logic device is disposed on a second upper surface of a second logic sub-region. A third logic device is disposed on a third upper surface of a third logic sub-region. Heights of the first, second, and third upper surfaces of the logic sub-regions monotonically decrease. By arranging logic devices on multiple recessed positions of the substrate, design flexibility is improved and devices with multiple operation voltages are better suited.

20 Claims, 14 Drawing Sheets

Related U.S. Application Data

(60) Provisional application No. 62/855,321, filed on May 31, 2019.

(51) Int. Cl.
*H01L 29/66* (2006.01)
*H01L 29/788* (2006.01)
*H10B 12/00* (2023.01)
*H10B 99/00* (2023.01)

(52) U.S. Cl.
CPC ........... *H01L 29/788* (2013.01); *H10B 12/09* (2023.02); *H10B 12/50* (2023.02); *H10B 99/00* (2023.02)

(56) References Cited

U.S. PATENT DOCUMENTS

| | | |
|---|---|---|
| 2005/0260815 A1 | 11/2005 | Liaw |
| 2007/0293029 A1* | 12/2007 | Ogawa ................... H10B 41/49 257/E21.639 |
| 2010/0216293 A1 | 8/2010 | Kwon et al. |
| 2011/0074337 A1 | 3/2011 | Adachi |
| 2011/0275206 A1 | 11/2011 | Kusumi |
| 2014/0319607 A1 | 10/2014 | Zhang et al. |
| 2016/0093633 A1 | 3/2016 | Toba |
| 2019/0006380 A1 | 1/2019 | Liu et al. |
| 2019/0148389 A1 | 5/2019 | Lin et al. |

OTHER PUBLICATIONS

Final Office Action dated Aug. 11, 2021 for U.S. Appl. No. 16/666,731.
Notice of Allowance dated Oct. 22, 2021 for U.S. Appl. No. 16/666,731.

\* cited by examiner

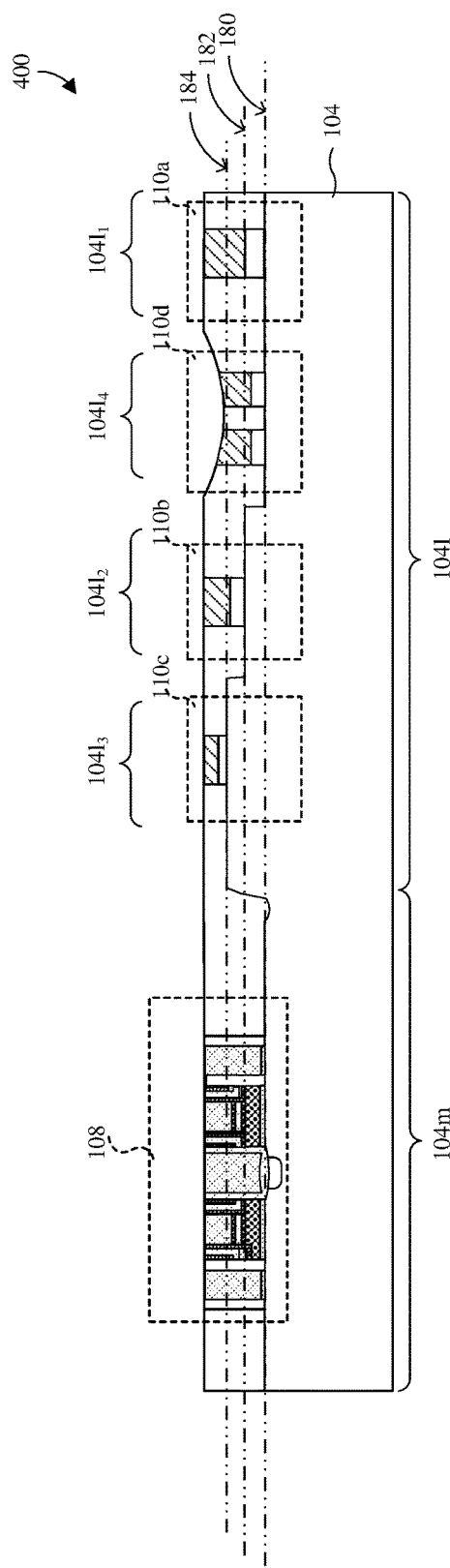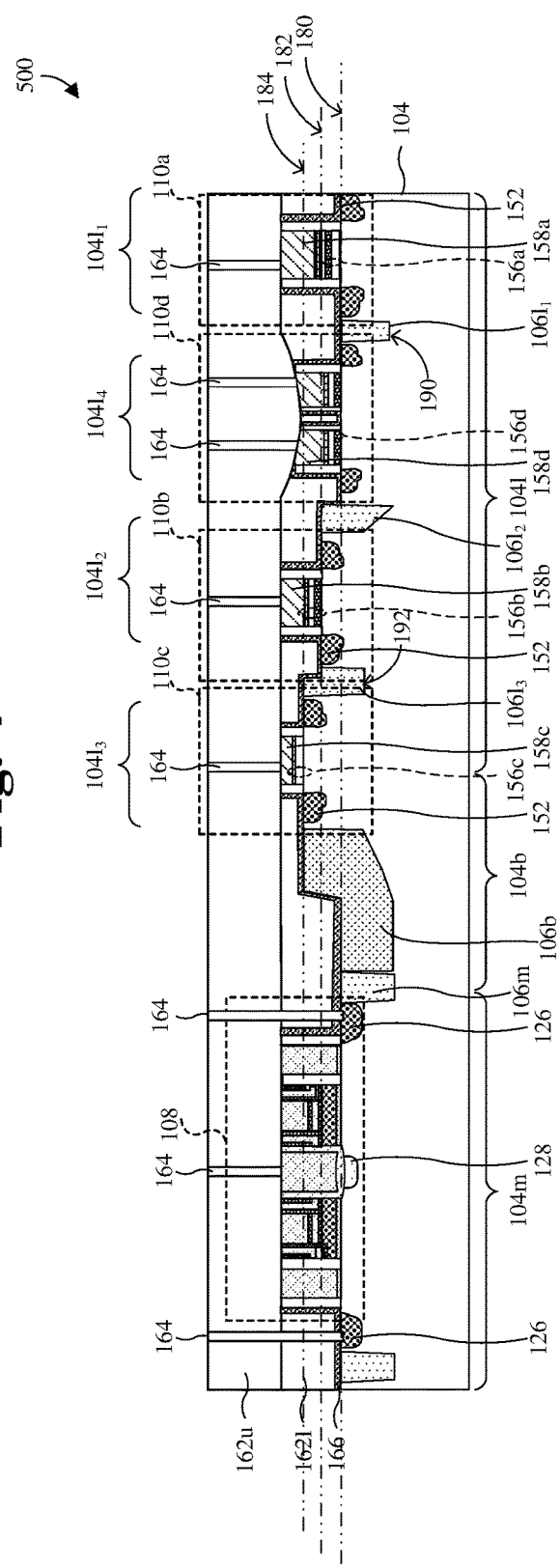

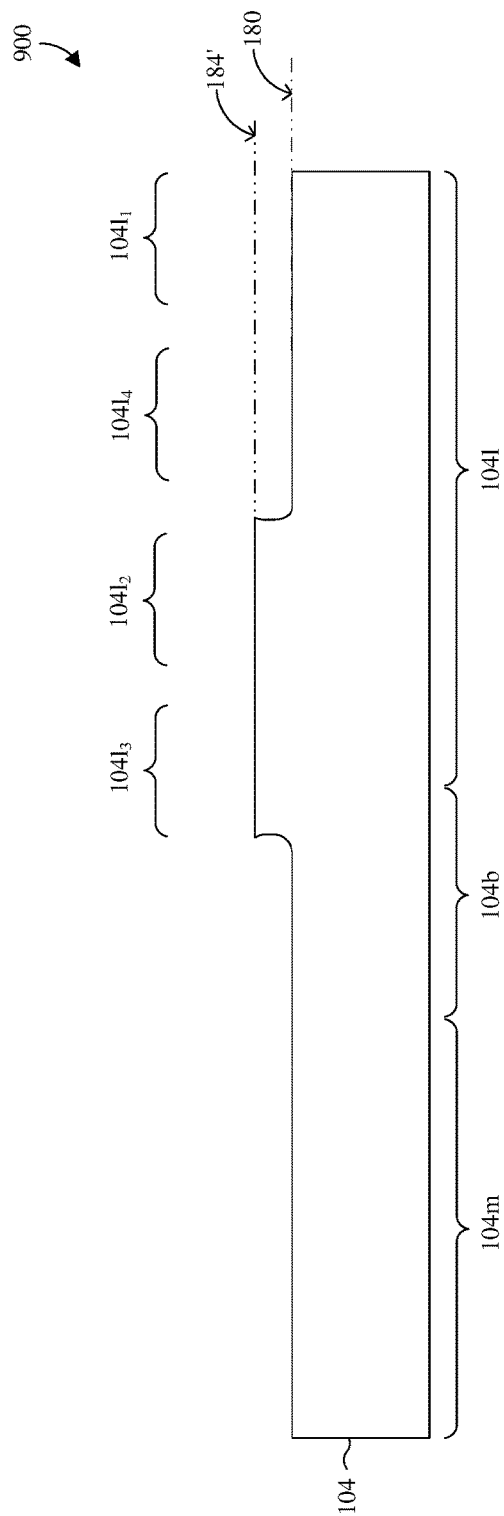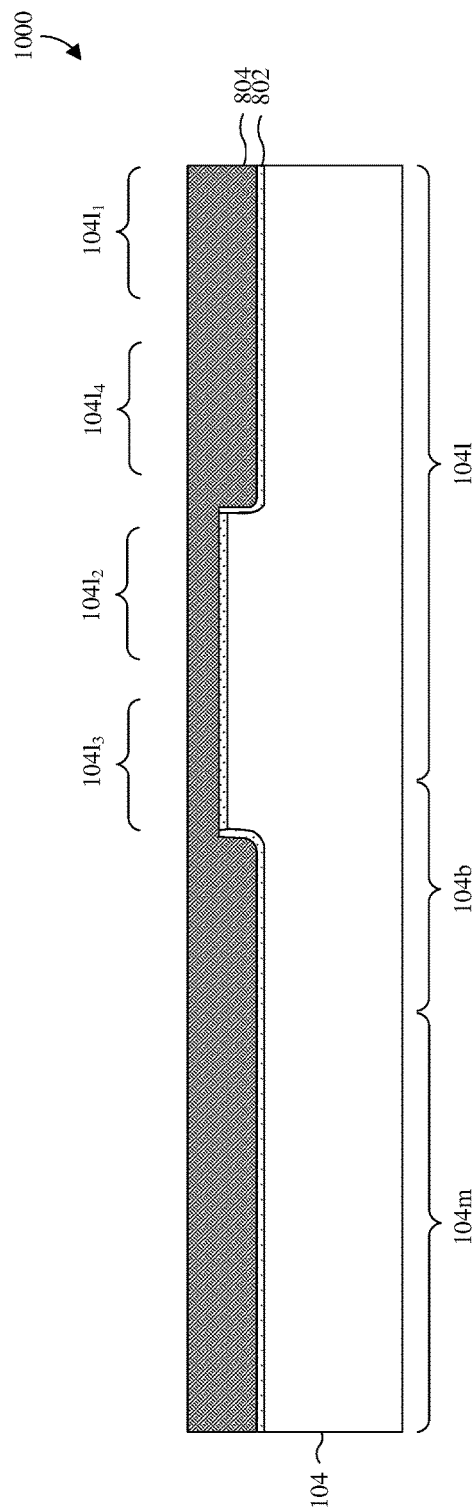

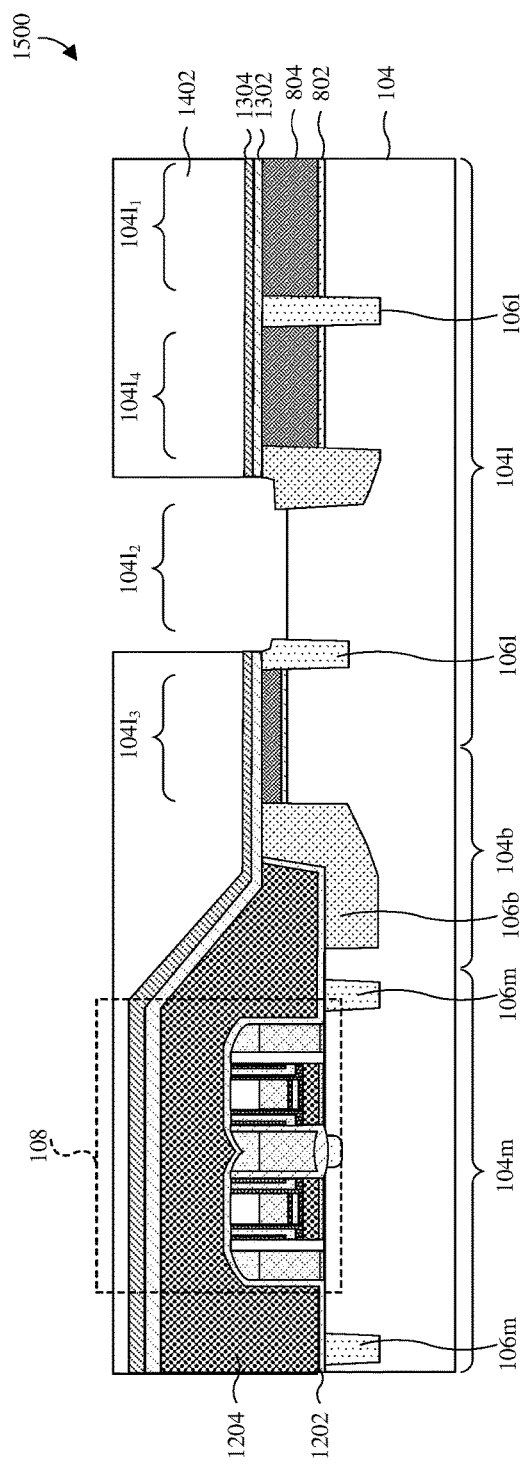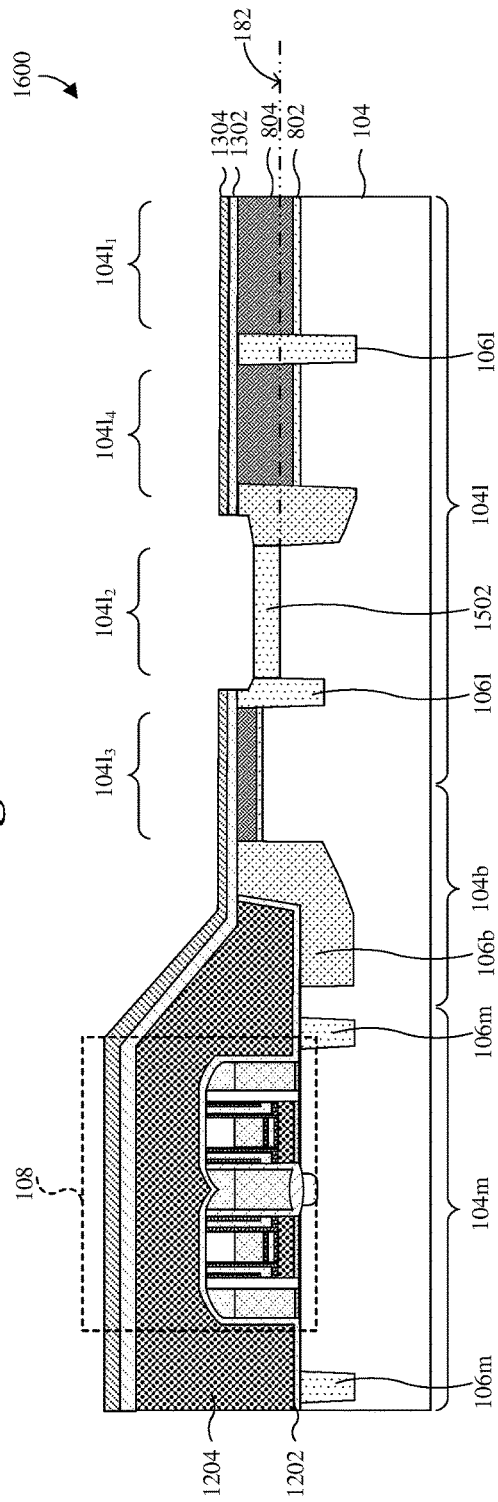
Fig. 15
Fig. 16

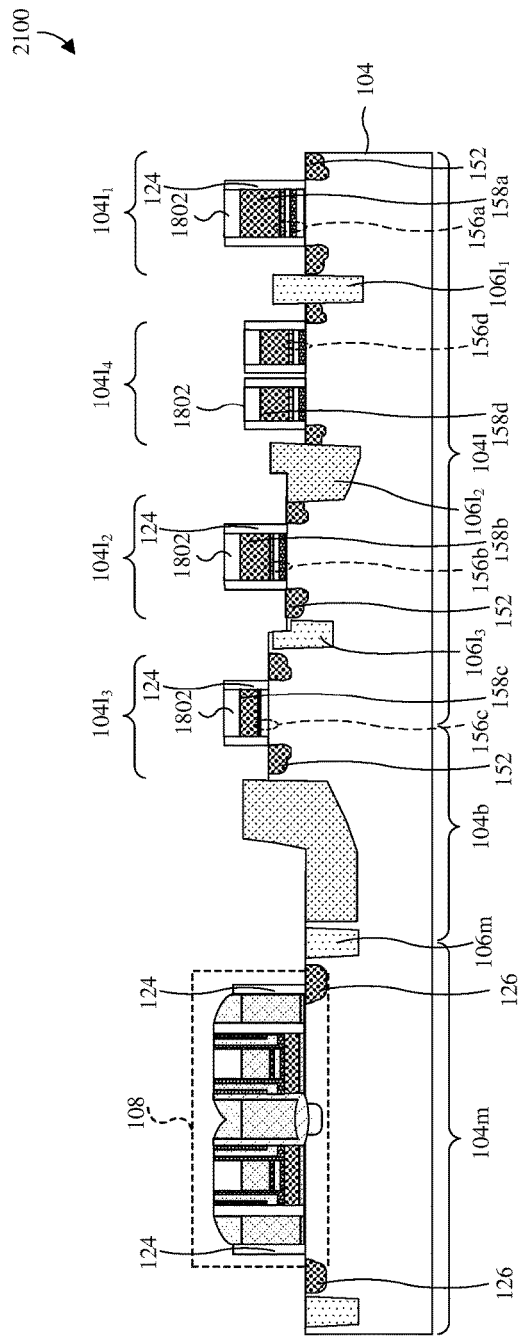
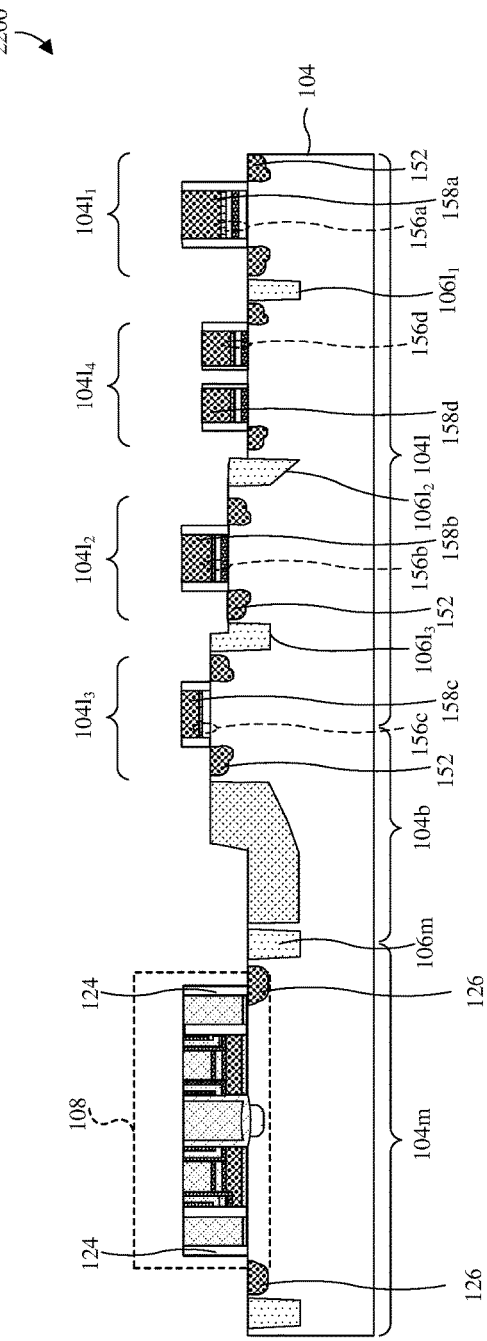
Fig. 21
Fig. 22

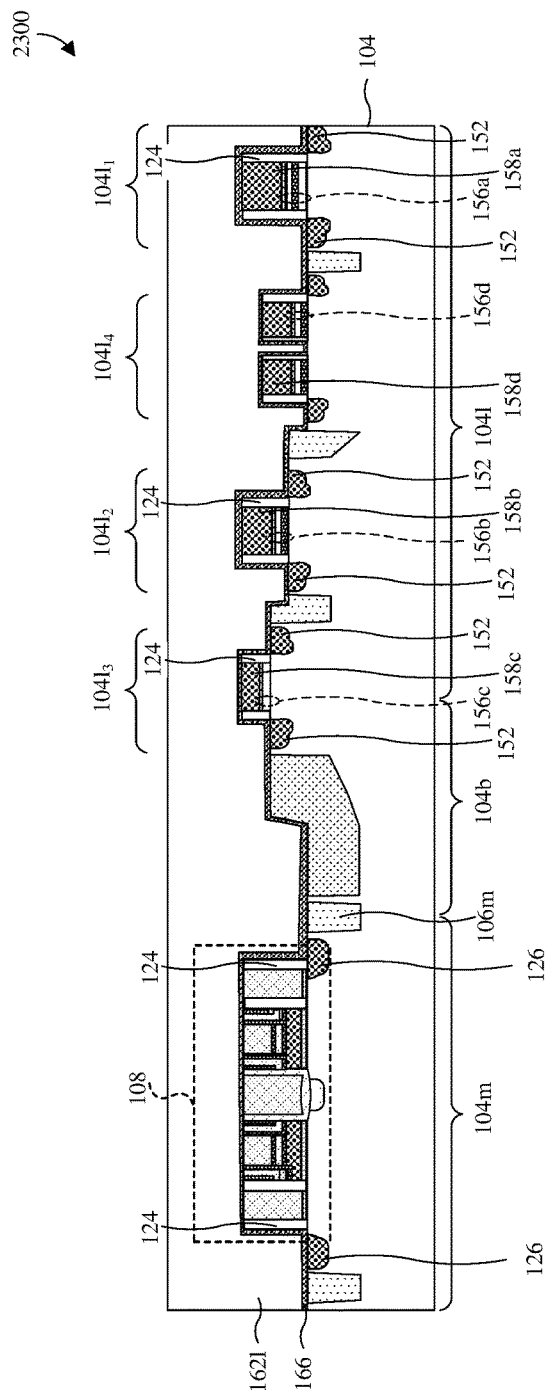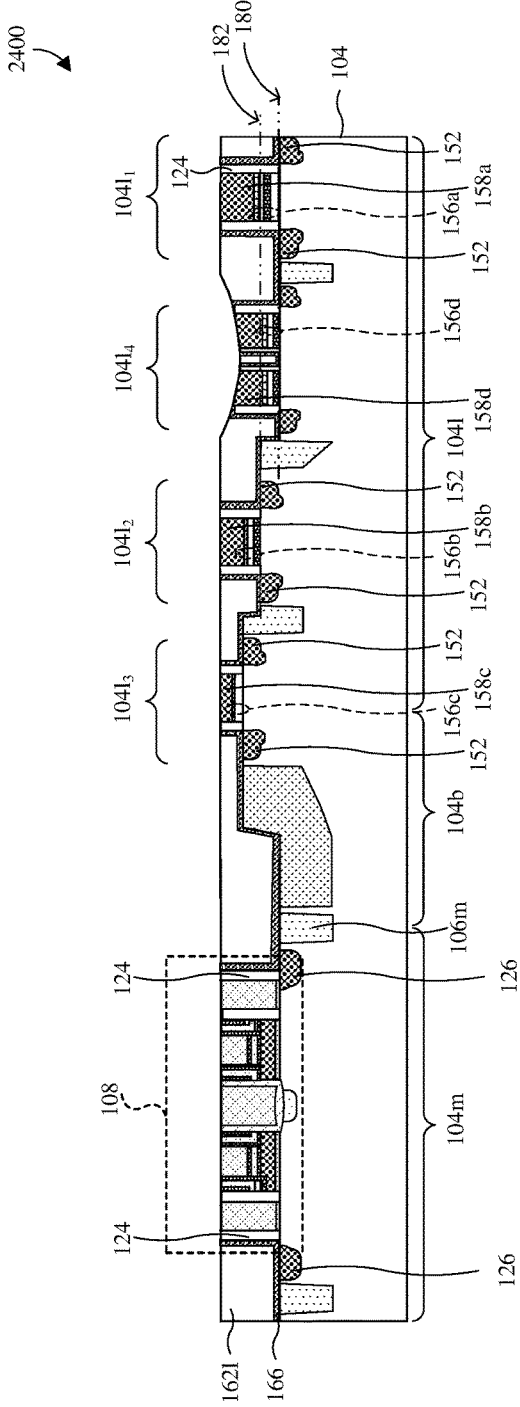

MULTI-TYPE HIGH VOLTAGE DEVICES FABRICATION FOR EMBEDDED MEMORY

REFERENCE TO RELATED APPLICATIONS

This Application is a Divisional of U.S. application Ser. No. 16/666,731, filed on Oct. 29, 2019, which claims the benefit of U.S. Provisional Application No. 62/855,321, filed on May 31, 2019. The contents of the above-referenced Patent Applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component (or line) that can be created) has decreased. Some advancements in the evolution of ICs include embedded memory technology. Embedded memory technology is the integration of memory devices with logic devices on the same semiconductor chip, such that the memory devices support the operation of the logic devices. An embedded memory IC includes a plurality of logic devices operating at different voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 shows a cross-sectional view of an IC comprising a plurality of logic devices arranged on multiple height levels of a substrate and operating at different voltages according to some embodiments FIGS. 5-6 illustrate more detailed cross-sectional views of some alternative embodiments of an integrated circuit (IC) comprising a plurality of logic devices disposed on multiple recessed positions of a substrate.

FIGS. 7-26 illustrate a series of cross-sectional views of some embodiments of a method for forming an IC comprising a plurality of logic devices disposed on multiple recessed positions of a substrate.

DETAILED DESCRIPTION

Figure 1:
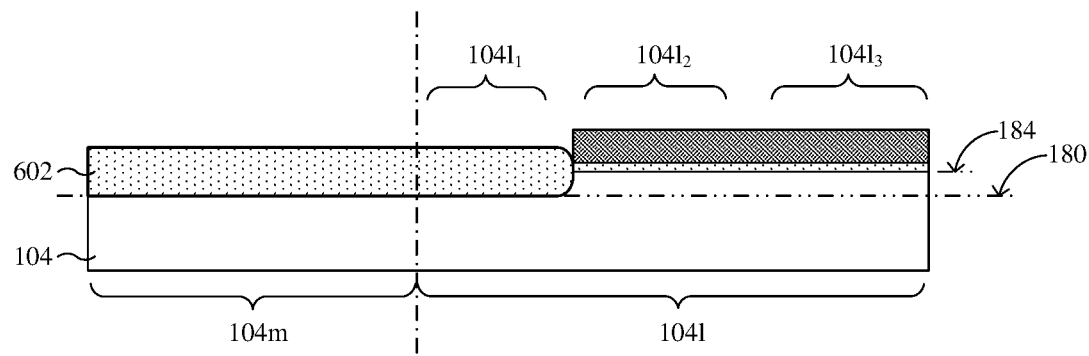
FIGS. 1-3 illustrate a series of cross-sectional views of some embodiments of a method for forming an embedded memory integrated circuit (IC).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

In an embedded memory IC, a plurality of different logic devices may respectively be arranged on a plurality of logic sub-regions and operate at different voltage levels. For example, a first logic device may be arranged on a first logic sub-region, may be used to drive memory cells, and may have a relatively high operating voltage level (e.g., greater than 10V). A second logic device may be arranged on a second logic sub-region, may be a medium voltage device (e.g., an RF (radio frequency) device or a MIM (metal-insulator-metal) device), and may have an operating voltage level smaller than the high voltage device (e.g., around 5V). A third logic device may be arranged on a third logic sub-region, may be an I/O (input and output) device, and may have an operating voltage level smaller than the second device (e.g. around 1.5V to 3V). There are also other logic devices operating at lower voltages, such as a word line device with an operating voltage level around 1V to 2V or a core device with an operating voltage level smaller than 1.5V. The core logic device has a gate dielectric with a smaller thickness. The high voltage device, on the other hand, has a gate dielectric with a greater thickness in order to handle the relatively high operating voltage level. The greater thickness of the gate dielectric contributes to a higher gate height of the high voltage devices, which would limit the process window when performing a planarization process such as a chemical mechanical polishing (CMP) process. The resulted gate electrode for the high voltage device may be too thin after the CMP process. In addition, patterns with a large area or a high pattern density design would result in dishing or erosion during the CMP process, which would introduce unwanted lowering of the polished surface.

Figure 2:
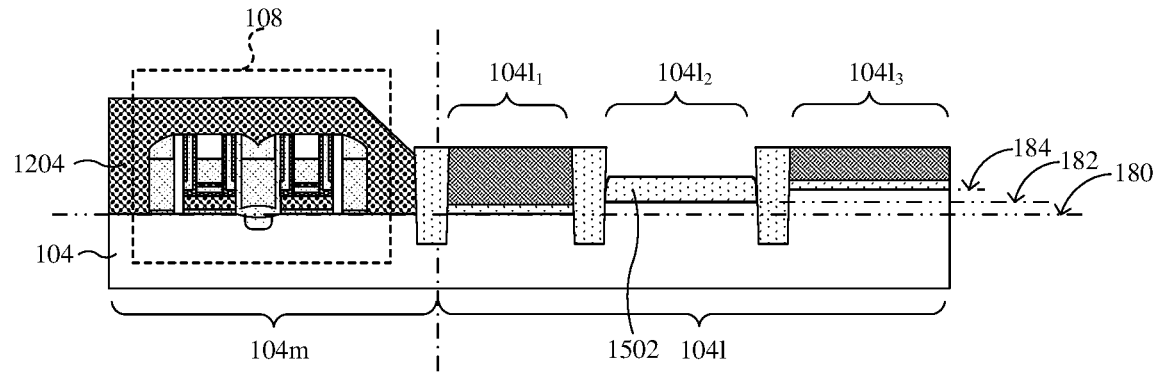
Figure 3:
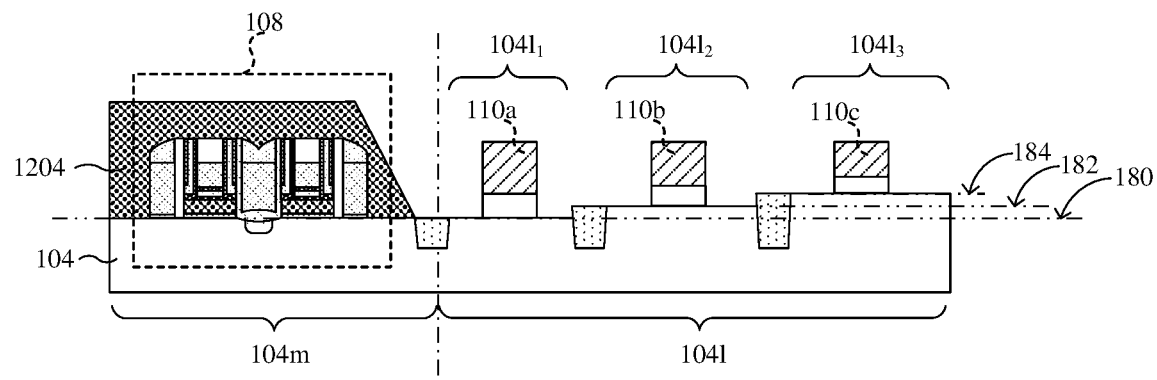

In view of the foregoing, various embodiments of the present application are directed to an integrated circuit (IC) comprising an embedded memory and a method for forming the IC with multiple recessed positions. By arranging logic devices on multiple recessed positions of the substrate, design flexibility is improved and devices with multiple operation voltages are better suited. Referring to FIGS. 1-3 as an example, a series of cross-sectional views of some embodiments of a method for forming an embedded memory integrated circuit (IC) is illustrated. As shown in FIG. 1, a substrate 104 is provided including a logic region 1041 having a plurality of logic sub-regions such as $1041_1$, $1041_2$, and $1041_3$. The plurality of logic sub-regions $1041_1$, $1041_2$, and $1041_3$ correspond to logic devices to be formed thereon, where the logic devices are configured to operate at different voltages. In some embodiments, multiple upper surfaces 180, 182, 184 of the substrate 104 are formed at recessed positions by multiple recessing processes. As shown in FIG. 1, a first recessing process includes firstly performing a first oxidation process on a first logic sub-region $1041_1$ to transfer a top layer of the substrate 104 to a first oxide precursor 602. Then a first etching process is performed to remove the first oxide precursor 602 formed by the wet oxidation process and lower and recess the substrate 104 to a first upper surface 184. As shown in FIG. 2, a second recessing process may be performed after the first recessing process on a second logic sub-region $1041_2$ to lower and recess the substrate 104 to a second upper surface 182. The second recessing process may be performed by a second oxidation process followed by a second etching process to form and remove a second oxide precursor 1502. In some embodiments, the first recessing process can be integrated to a recessing process of the memory region 104m, and the second recessing process may be performed after the formation of the memory cell structure. Thus, the first upper surface 184 may have the same height with a top surface of the memory region 104m. Since the memory region 104m may contain a memory cell structure 108 with a greater height, the top surface of substrate 104 of the memory region may be the lowest recessed position of the logic region 1041. In some embodiments, the memory cell structure 108 may be covered by a dummy capping layer 1204 for the patterning and forming of the second recessed position and also for the formation of the logic devices 110a-110c. The logic devices 110a-110c are formed on various non-recessed and recessed positions after the second recessed position is prepared.

Referring to FIG. 4 as an example, in some embodiments, an IC 400 comprises a memory region 104m and a logic region 1041 integrated in a substrate 104. A memory cell structure 108 is disposed on the memory region 104m. A plurality of logic devices 110a-110d are respectively arranged on a plurality of logic sub-regions $1041_1$-$1041_4$. The substrate 104 on the plurality of logic sub-regions $1041_1$-$1041_4$ may have varied heights. A first logic device 110a may sit on a first upper surface 180, which is a first recessed position stepping down from a top surface of the substrate 104. A second logic device 110b may sit on a second upper surface 182 of the substrate 104, which is a second recessed position stepping down from the top surface of the substrate but higher than the first upper surface 180. A third logic device 110c may sit on a third upper surface 184 of the substrate 104, which may be a less recessed position than the first and second recessed positions or even the top surface of the substrate 104. The lower sitting logic devices 110a/110b may have either a thicker gate dielectric, a lager lateral device dimension, or a greater pattern density. By arranging logic devices on multiple recessed positions of the substrate 104, design flexibility is improved and devices with multiple operation voltages are better suited.

In some embodiments, the first logic device 110a on a first logic sub-region $1041_1$ is configured to operate at a first voltage, the second logic device 110b on a second logic sub-region $1041_2$ is configured to operate at a second voltage, and the third logic device 110c on a third logic sub-region $1041_3$ is configured to operate at a third voltage. The second voltage is smaller than the first voltage, and the third voltage is smaller than the first voltage and the second voltage. The first logic device 110a and the memory region 104m may both be arranged on the first recessed positon (e.g., the first upper surface 180), which can be formed by performing a first recessing process as shown by FIG. 1. The second logic device 110b may be arranged on a second recessed position (e.g. the second upper surface 182) between the first recessed position and the top surface of the substrate 104. As shown by FIG. 2, the second recessed position may be formed by a second recessing process after forming the memory cell structure 108 and covering the formed memory cell structure 108 by a dummy capping layer 1204. The logic devices 110a-110c can be formed after the second recessing process. In addition, a fourth logic device 110d can be formed in a fourth logic sub-region $1041_4$ of the logic region 1041 and having a high pattern density and/or large lateral dimensions of the logic devices 110a-110c. In order to offset erosion or dishing effects of a later performed CMP process, the fourth logic device 110d with a high pattern density or a large lateral dimension may also be arranged at a lower position. Thus, the fourth logic sub-region $1041_4$ may be positioned to the first recessed position though the fourth logic device 110d thereon may have an operating voltage lower than that of the first logic sub-region $1041_1$. The fourth logic device 110d may have a top surface lower than top surfaces of the logic devices 110a-110c.

FIG. 5 shows a cross-sectional view of an IC 500 comprising a plurality of logic devices arranged on multiple height levels of a substrate and operating at different voltages according to some alternative embodiments. The IC 500 has a substrate 104 including a memory region 104m and a logic region 1041 separated by a boundary region 104b. The substrate 104 may comprise, for example, a bulk silicon substrate, a group III-V substrate, a silicon-on-insulator (SOI) substrate, or some other suitable semiconductor substrate(s). A memory cell structure 108 is disposed on the memory region 104m. A plurality of logic devices 110a-110d is disposed on a plurality of corresponding logic sub-regions $1041_1$-$1041_4$. For example, a first logic device 110a is disposed on a first logic sub-region $1041_1$, a second logic device 110b is disposed on a second logic sub-region $1041_2$, a third logic device 110c is disposed on a third logic sub-region $1041_3$, and a fourth logic device 110d is disposed on a fourth logic sub-region $1041_4$. The first logic device 110a may be used to drive memory cells and may have a relatively high operating voltage level. For example, the relatively high operating voltage level may be greater than 10V, but other suitable voltages are amenable. The second logic device 110b may be a medium voltage device (e.g., an RF (radio frequency) device or a MIM (metal-insulator-metal) device) and may have an operating voltage level smaller than the high voltage device. For example, the operating voltage level of the second logic device 110b may be around 5V, but other suitable voltages are amenable. The third logic device 110c may be an I/O (input and output) device and may have an operating voltage level smaller than the second device. For example, the operating voltage level of the third logic device 110c may be around 1.5V to 3V, but other suitable voltages are amenable. The fourth logic device 110d may be a word line device and may have an operating voltage level smaller than the third logic device 110c. For example, the operating voltage level of the fourth logic device 110d may be around 1V to 2V, but other suitable voltages are amenable. The logic devices 110a-110d may each be, for example, an IGFET, a MOSFET, a DMOS device, a BCD device, some other suitable transistor device (s), or some other suitable semiconductor device(s).

In some embodiments, the logic devices 110a-110d respectively comprises a pair of logic source/drain regions 152 within the substrate 104. The logic source/drain regions 152 are disposed on opposite sides of corresponding logic gate electrodes 158a-158d and logic gate dielectrics 156a-156d. The pair of logic source/drain regions 152 is heavily doped semiconductor regions having a first doping type (e.g., p-type or n-type). For ease of illustration, for components sharing a numeral, only one or some of the components are labeled, and some other components that have the same shading, the symmetrical location, and/or repeated structures may not be labeled. For example, only some of the logic source/drain regions are labeled 152, but similar regions alongside the corresponding gate electrodes may also have pairs of source/drain regions not drawn or labeled. In some embodiments, the operation voltages of the first, second, third, and fourth logic devices 110a, 110b, 110c, and 110d decrease monotonically in the order, and so are the thicknesses of the corresponding logic gate dielectrics 156a, 156b, 156c, and 156d. In some embodiments, some of the first, second, third, and fourth logic devices 110a, 110b, 110c, and 110d may have similar or substantially same operation voltage and gate dielectric thickness. Though not shown in FIG. 5, a silicide pad may be disposed on the logic gate electrodes 158a-158d. The silicide pad may be or otherwise comprise, for example, nickel silicide or some other suitable silicide(s). A silicide pad can also be formed on the logic source/drain regions 152. In some embodiments, the logic gate electrodes 158a-158d may comprise metal. The logic gate electrodes 158a-158d may also be or otherwise comprise other conductive material, for example, doped polysilicon or some other suitable conductive material(s). The logic gate dielectrics 156a-156d may be or otherwise comprise, for example, silicon nitride, silicon oxide, a high κ dielectric, some other suitable dielectric(s), or any combination of the foregoing. As used herein and hereafter, a high κ dielectric is a dielectric with a dielectric constant κ greater than about 3.9. During operation, by applying a bias, the logic gate electrodes 158a-158d respectively control carriers flowing between the corresponding pair of logic source/drain regions 152 through a corresponding logic channel within the substrate 104 underlying the corresponding logic gate electrodes 158a-158d. The logic channel is a doped semiconductor region having a second doping type (e.g., p-type or n-type) opposite the first doping type. In some embodiments, the memory cell structure 108 comprises a pair of individual memory source/drain regions 126 and a common memory source/drain region 128 separated by a pair of memory channels. The individual memory source/drain regions 126 and the common memory source/drain region 128 are doped semiconductor regions having a first doping type (e.g., p-type or n-type). The memory channels are doped semiconductor regions having a second doping type (e.g., p-type or n-type) opposite the first doping type.

In some embodiments, a plurality of isolation structures is disposed within the substrate 104. The isolation structures may comprise a memory isolation structure 106m disposed within the memory region 104m and surrounding the memory cell structure 108. Further, the isolation structures may comprise a boundary isolation structure 106b within the boundary region 104b. Further yet, the isolation structures may comprise a plurality of logic isolation structures $1061_1$-$1061_3$ within the logic region 1041, between the logic devices 110a-110d. The logic devices 110a-110d are physically and electrically separated by the logic isolation structures $1061_1$-$1061_3$. The plurality of isolation structures may be or otherwise comprise, for example, a shallow trench isolation (STI) structure, a deep trench isolation (DTI) structure, or some other suitable isolation structure(s). In some embodiments, the memory isolation structure 106m and the boundary isolation structure 106b may extend to the same or substantially same depth in the substrate 104. A first logic isolation structures $1061_1$ may have a bottom surface locating at a first depth 190 which is the same or substantially same depth of the memory isolation structure 106m. A second logic isolation structures $1061_2$ has a bottom surface on one side closer to the first logic isolation structures $1061_1$ may have the first depth 190 that is same or substantially same depth in the substrate 104 with the first logic isolation structures $1061_1$. The second logic isolation structures $1061_2$ on an opposite side to the first logic isolation structures $1061_1$ may have a second depth 192 in the substrate 104 smaller than that of the first logic isolation structures $1061_1$. A bottom surface of a third logic isolation structures $1061_3$ may have the same or substantially same depth to the second depth 192.

Figure 6:
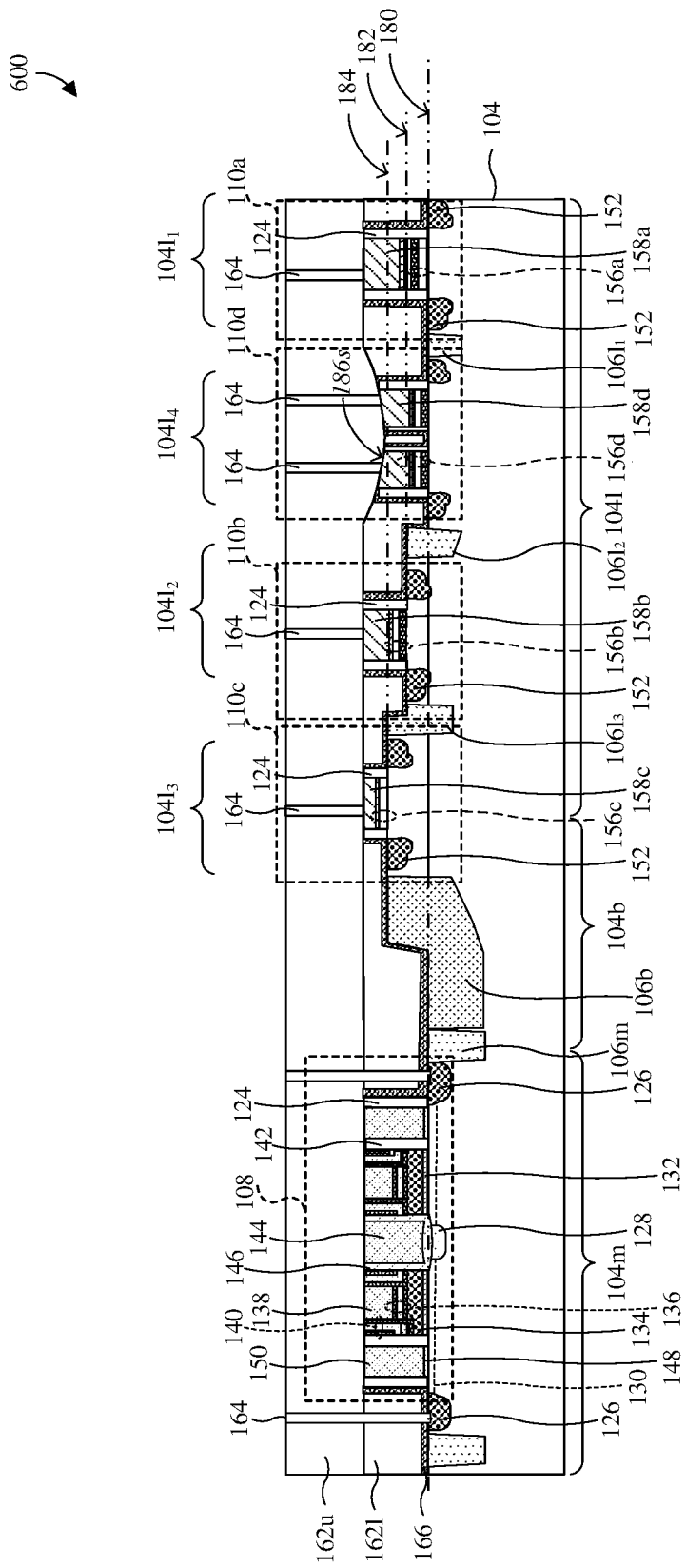

FIG. 6 shows a cross-sectional view of an IC 600 with more details according to some alternative embodiments. The descriptions related to FIG. 5 can be fully incorporated in the IC 600. As shown in FIG. 6, a pair of control gate electrodes 138, a pair of control gate dielectric layers 136, a pair of floating gate electrodes 134, and a pair of floating gate dielectric layer 132 are stacked on a memory channels 130. In some embodiments, the control gate dielectric layers 136 may comprise a tri-layer structure. For example, in some embodiments, the tri-layer structure may comprise an ONO structure having a first dielectric layer (e.g. a silicon dioxide layer), a nitride layer (e.g. a silicon nitride layer) contacting the first dielectric layer, and a second dielectric layer (e.g. a silicon dioxide layer) contacting the nitride layer. A control gate spacer 140 lines opposite sidewalls of each of the control gate electrodes 138 overlying each of the floating gate electrodes 134. A floating gate spacer 142 lines a sidewall of the floating gate electrodes 134. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 may comprise ONO films. A pair of select gate dielectric layers 148 and a pair of select gate electrodes 150 are stacked on the selectively-conductive memory channels 130. An erase gate electrode 144 and an erase gate dielectric layer 146 overlie the common memory source/drain region 128, laterally between the floating gate electrodes 134. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s). During operation, charges (e.g., electrons) can be injected to the floating gate electrode 134 to program the memory cell structure 108. A low voltage is applied to minimize drain current and leads to a relatively small programming power. A high voltage is applied to the control gate electrode 138 to attract or repel electrons to or from the floating gate electrode 134, thereby yielding a high injection or removal efficiency. The memory cell structure 108 may be or otherwise comprise, for example, third generation embedded super flash (ESF3) memory, first generation embedded super flash (ESF1) memory, silicon-oxide-nitride-oxide-silicon (SONOS) memory, metal-oxide-nitride-oxide-silicon (MONOS) memory, or some other suitable type(s) of memory.

In some embodiments, a main sidewall spacer 124 lines sidewall surfaces of the logic gate electrodes 158a-158d and the logic gate dielectrics 156a-156d. The main sidewall spacer 124 may also have components disposed along sidewalls of the select gate electrodes 150 in the memory region 104m. The main sidewall spacer 124 may be or otherwise comprise, for example, silicon nitride, silicon oxide, or some other suitable dielectric(s). Further, in some embodiments, a contact etch stop layer (CESL) 166 is disposed along an upper surface of the substrate 104 and extends upwardly along sidewall surfaces of the main sidewall spacer 124. Further, in some embodiments, the CESL 166 is separated from the logic gate electrodes 158a-158d and the logic gate dielectrics 156a-156d by the main sidewall spacer 124. An inter-layer dielectric (ILD) layer 162 is disposed on the contact etch stop layer (CESL) 166 and covers the logic devices 110a-110d. Further, the ILD layer 162, is between and overlies the memory cell structure 108 and the logic devices 110a-110d. The inter-layer dielectric (ILD) layer 162 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9. Further yet, in some embodiments, contact vias 164 extend through the inter-layer dielectric (ILD) layer 162 to the logic source/drain regions 152 and the logic gate electrodes 158a-158d. The contact vias 164 are conductive and may be or otherwise comprise, for example, tungsten, aluminum copper, copper, aluminum, some other suitable metal(s), or some other suitable conductive material(s). In some embodiments, the inter-layer dielectric (ILD) layer 162 may comprise a plurality of dielectric layers made of the same or different materials. For example, the inter-layer dielectric (ILD) layer 162 may comprise a lower ILD layer 162l and an upper ILD layer 162u stacked one on another. The lower ILD layer 162l may have a top surface even with that of the memory cell structure 108 and/or at least some of the logic devices 110a-110d. Some other logic devices may have a top surface 186s lower than the top surface of the lower ILD layer 162l.

In some embodiments, the first gate dielectric 156a of the first logic device 110a comprises a first stack of gate dielectric comprising at least three gate dielectric precursor layers. The second logic gate dielectric 156b of the second logic device 110b comprises a second stack of gate dielectric comprising two of the three gate dielectric precursor layers. The third gate dielectric 156c of the third logic device 110c comprises a third stack of gate dielectric comprising one of the three gate dielectric precursor layers. The portions of the gate dielectric precursor layers in the logic sub-regions $104l_1$-$104l_3$ have the same composition and thickness. In some embodiments, portions of a high κ dielectric layer are stacked on top of the gate dielectrics, directly below the corresponding logic gate electrodes 158a, 158b, 158c, or 158d.

With reference to FIGS. 7-26, a series of cross-sectional views 700-2600 illustrates some embodiments of a method for forming an IC comprising a plurality of logic devices operating at different voltages.

Figure 7:
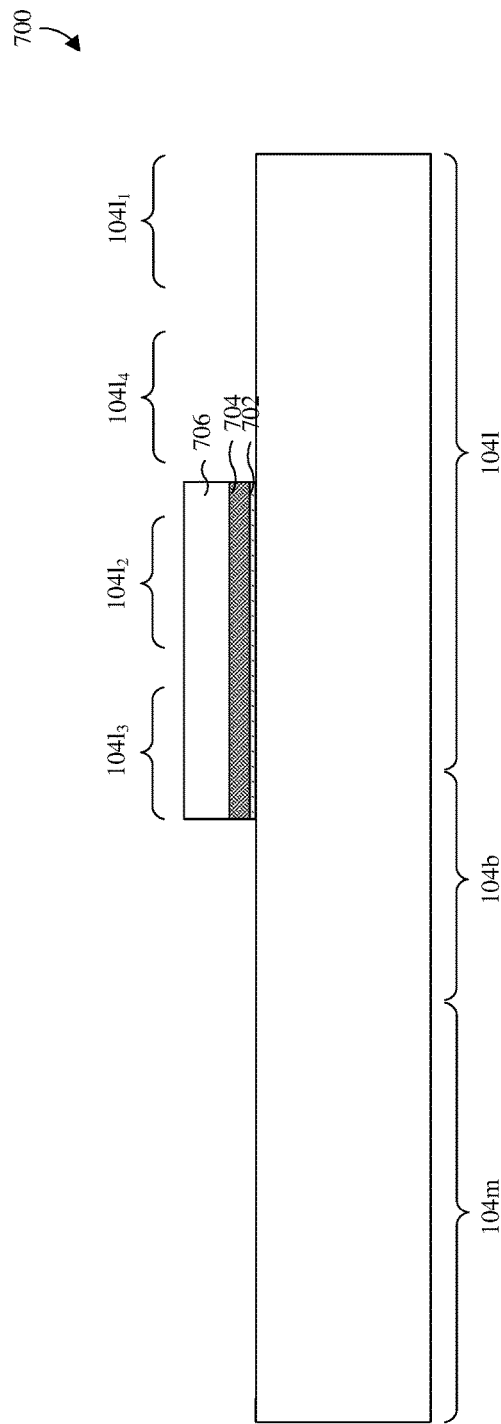

As illustrated by the cross-sectional view 700 of FIG. 7, a substrate 104 is provided. The substrate 104 includes a memory region 104m and a logic region 104l separated by a boundary region 104b. The logic region 104l comprises a plurality of logic sub-regions, such as a first logic sub-region $104l_1$, a second logic sub-region $104l_2$, a third logic sub-region $104l_3$, and a fourth logic sub-region $104l_4$. In some embodiments, a first lower pad layer 702 is formed on the logic region 104l, and a first upper pad layer 704 is formed covering the first lower pad layer 702. The first lower pad layer 702 and the first upper pad layer 704 are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The first lower pad layer 702 may, for example, be formed of silicon oxide or some other suitable dielectric(s), and/or the first upper pad layer 704 may, for example, be formed by silicon nitride or some other suitable dielectric(s).

A patterning process may be performed to the memory region 104m and selective logic sub-regions, for example, the first logic sub-region $104l_1$ and the fourth logic sub-region $104l_4$. In some embodiments, a photo lithography process is performed with the second logic sub-region $104l_2$ and the third logic sub-region $104l_3$ covered by a photoresist layer 706. The first lower pad layer 702 and the first upper pad layer 704 are removed from the first logic sub-region $104l_1$, the fourth logic sub-region $104l_4$, and the memory region 104m.

Figure 8:
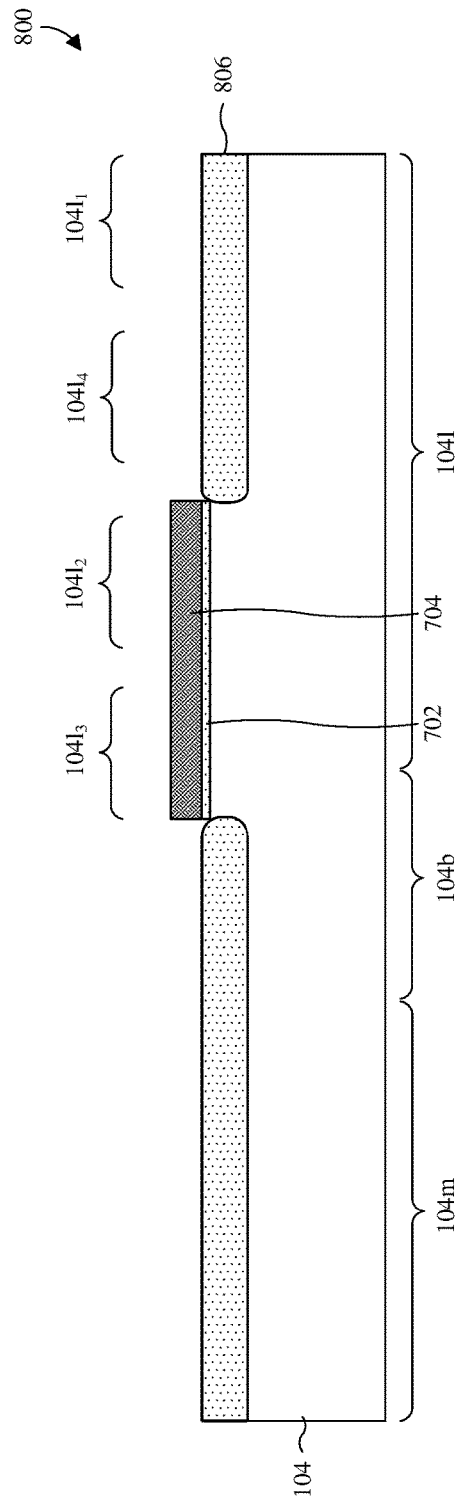

As illustrated by the cross-sectional view 800 of FIG. 8, a first recessing process is performed, and the substrate 104 is recessed within the first logic sub-region $104l_1$, the fourth logic sub-region $104l_4$, and the memory region 104m. With the second logic sub-region $104l_2$ and the third logic sub-region $104l_3$ covered by the first lower pad layer 702 and the first upper pad layer 704, a precursor layer 806 is formed from a top surface of the substrate 104, and thus reduces a height of the top surface of the substrate 104 within the first logic sub-region $104l_1$, the fourth logic sub-region $104l_4$, and the memory region 104m. In some embodiments, the precursor layer 806 is an oxide layer and formed by a wet oxidation process or a thermal process.

As illustrated by the cross-sectional view 900 of FIG. 9, the precursor layer 806 (see FIG. 8) is subsequently removed, leaving a first upper surface 180 of the substrate 104 recessed from the top surface 184' of the substrate 104. In some embodiments, the precursor layer 806 may be removed by a wet etching process.

As illustrated by the cross-sectional view 1000 of FIG. 10, a second lower pad layer 802 is formed within the first logic sub-region $104l_1$, the fourth logic sub-region $104l_4$, and the memory region 104m. A second upper pad layer 804 is formed on the second lower pad layer 802. The second upper pad layer 804 may be formed by depositing a dielectric material covering the memory region 104m, the logic region 104l, and the boundary region 104b. Then an etching process is performed to lower the second upper pad layer 804 in the second logic sub-region $104l_2$ and the third logic sub-region $104l_3$. In some embodiments, a planarization process is performed to lower the second upper pad layer 804 in the second logic sub-region $104l_2$ and the third logic sub-region $104l_3$ and to may form a planar top surface of the second upper pad layer 804. The second lower pad layer 802 may, for example, be formed of silicon oxide or some other suitable dielectric(s), and/or the second upper pad layer 804 may, for example, be formed by silicon nitride or some other suitable dielectric(s).

Figure 11:
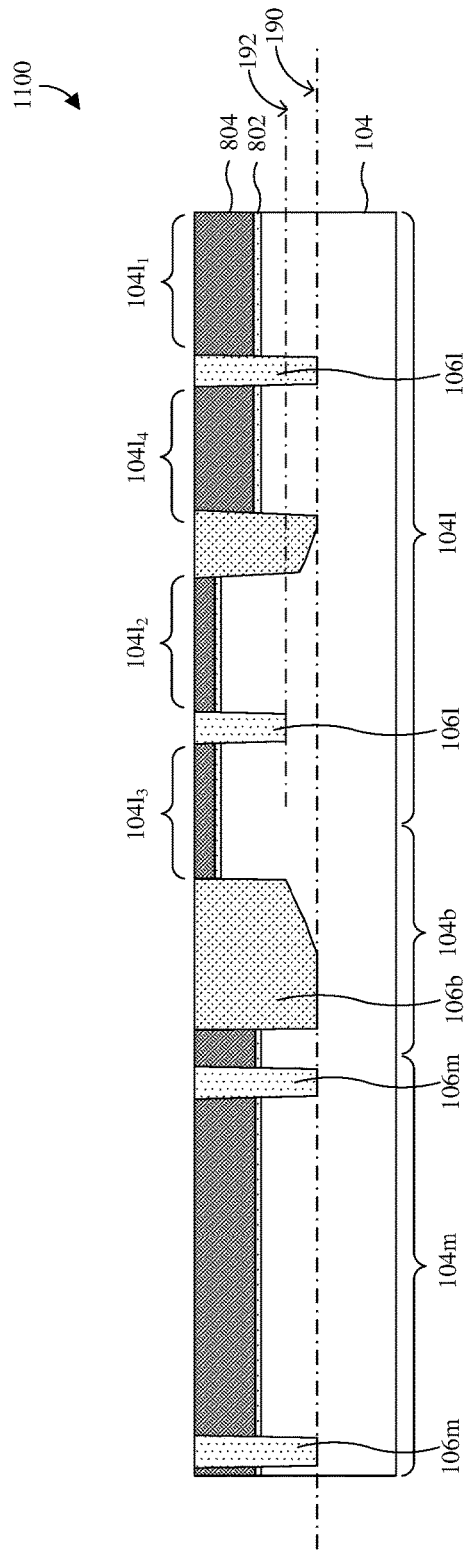

As illustrated by the cross-sectional view 1100 of FIG. 11, a plurality of isolation structures is formed within the substrate 104. An etching process is firstly performed to form a plurality of trenches extending into the substrate 104 within the memory region 104m, the boundary region 104b, and the logic region 104l and separating a first logic sub-region $1041_1$, a second logic sub-region $1041_2$, a third logic sub-region $1041_3$, and a fourth logic sub-region $1041_4$. The first logic sub-region $1041_1$ may, for example, be used to form a high voltage device having a relatively high operating voltage level (e.g., greater than 10V). The second logic sub-region $1041_2$ may, for example, be used to form a medium voltage device having an operating voltage level smaller than the high voltage device (e.g., around 5V). The third logic sub-region $1041_3$ may, for example, be used to form an I/O (input and output) device having an operating voltage level smaller than the medium voltage device (e.g., around 1.5V to 3V) or a core device having the smallest operating voltage (e.g., lower than 1.5V). The fourth logic sub-region $1041_4$ may, for example, be used to form a word line device having an operating voltage level smaller than the I/O (input and output) device (e.g., around 1V to 2V). The plurality of trenches is then filled with dielectric material to form the plurality of isolation structures, including a memory isolation structure 106m, a boundary isolation structure 106b, and a logic isolation structure 106l. The dielectric material may, for example, be formed of silicon oxide or some other suitable dielectric material(s), and/or may, for example, be performed by CVD, PVD, sputtering, or some other suitable deposition process(es). The plurality of isolation structures may be formed by underetching the second lower pad layer 802 (e.g., an oxide pad) first, followed by growing a liner oxide in the plurality of trenches. Then, the rest of the plurality of trenches is filled with a deposited oxide. Next, the excessive (deposited) oxide is removed with a planarization process. The planarization process may, for example, be performed by a chemical mechanical polish (CMP) or some other suitable planarization process(es). In some embodiments, the memory isolation structure 106m, the logic isolation structure 106l, and the boundary isolation structure 106b may extend to the same or substantially same depth in the substrate 104. In some alternative embodiments, the memory isolation structure 106m and some of the logic isolation structure 106l between the first logic sub-region $1041_1$ and the fourth logic sub-region $1041_4$ are formed to a first depth 190 greater than a second depth 192 of other logic isolation structures 106l between the second logic sub-region $1041_2$ and the third logic sub-region $1041_3$.

Figure 12:
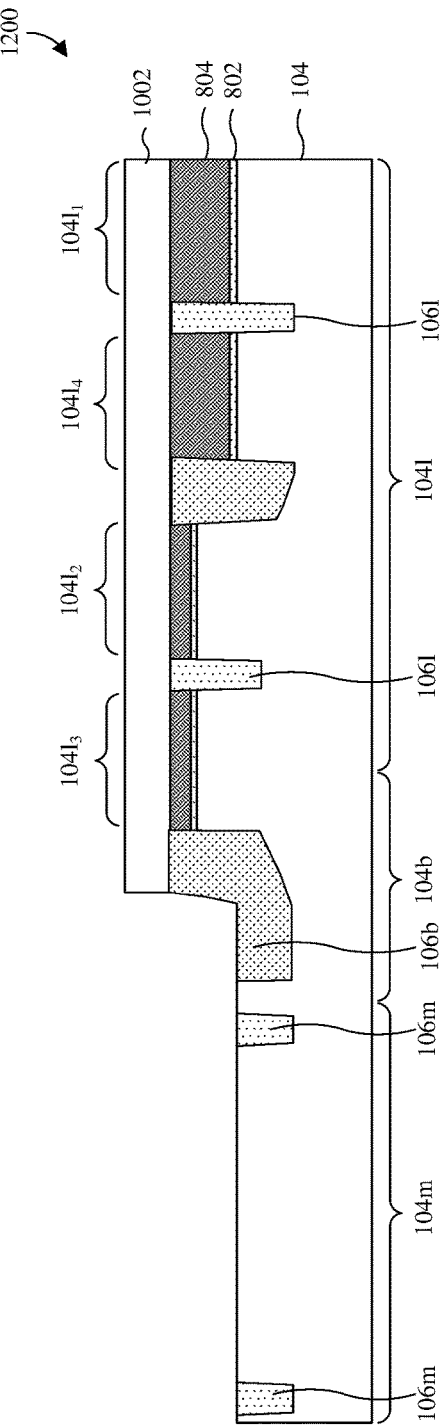
Figure 13:
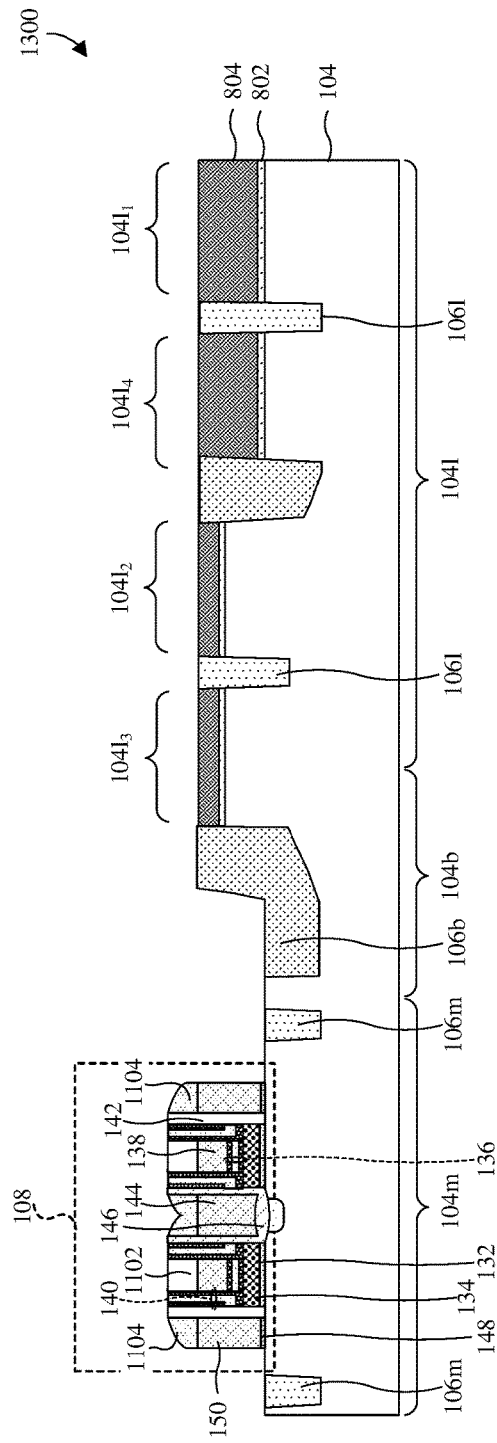

As illustrated by the cross-sectional views 1200-1300 of FIGS. 12-13, a series of manufacturing processes are performed to form a memory cell structure 108 on the memory region 104m. Some of the manufacturing processes are described below as an example and not for limiting purposes. In FIG. 12, with a masking layer 1002 covering the logic region 104l and a portion of the boundary region 104b closer to the logic region 104l, an etching process is performed to remove the second upper pad layer 804, the second lower pad layer 802, and an upper portion of the memory isolation structure 106m within the memory region 104m. An upper left portion of the boundary isolation structure 106b may be removed concurrently. The etching process may comprise a series of dry and/or wet etching processes. The masking layer 1002 may be formed by photoresist. In FIG. 13, a pair of control gate electrodes 138, a pair of control gate dielectric layers 136, a pair of floating gate electrodes 134, and a pair of floating gate dielectric layer 132 are formed on the memory region 104m. In some embodiments, the control gate dielectric layers 136 may comprise a tri-layer structure. For example, in some embodiments, the tri-layer structure may comprise an ONO structure having a first dielectric layer (e.g., a silicon dioxide layer), a nitride layer (e.g., silicon nitride layer) contacting the first dielectric layer, and a second dielectric layer (e.g., a silicon dioxide layer) contacting the nitride layer. A control gate spacer 140 is formed lining opposite sidewalls of each of the control gate electrodes 138 and overlying each of the floating gate electrodes 134. A floating gate spacer 142 is formed lining a sidewall of the floating gate electrodes 134 and the control gate spacer 140. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 may comprise ONO films. A pair of select gate dielectric layers 148 and a pair of select gate electrodes 150 are formed on opposite sides of the floating gate spacers 142. An erase gate electrode 144 and an erase gate dielectric layer 146 are formed laterally between the floating gate electrodes 134. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s). In some embodiments, a control gate hard mask 1102 and a select gate hard mask 1104 are respectively formed on the control gate electrodes 138 and the select gate electrodes 150.

Figure 14:
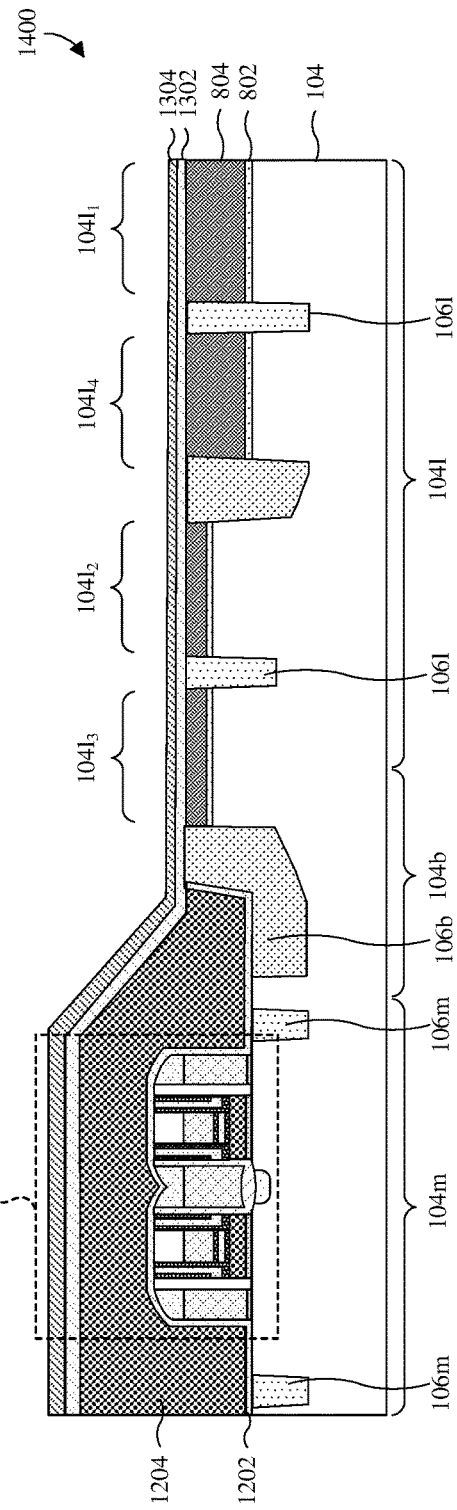

As illustrated by the cross-sectional view 1400 of FIG. 14, a dummy liner layer 1202 and a dummy capping layer 1204 are formed and patterned to cover the memory cell structure 108 but not the logic region 104l. The dummy liner layer 1202 may, for example, be formed conformally. In some embodiments, the dummy liner layer 1202 is formed of silicon oxide or some other suitable dielectric(s). In some embodiments, the dummy capping layer 1204 is formed of polysilicon or some other suitable material(s). Further, the dummy liner layer 1202 and/or the dummy capping layer 1204 may, for example, be formed by CVD, PVD, some other suitable deposition process(es), or any combination of the foregoing. Thereafter, a patterning process may be performed. In some embodiments, the patterning process is performed by forming and patterning a photoresist layer (not shown) covering the memory region 104m. An etchant is then applied with the photoresist layer in place until the etchant reaches an upper surface of the substrate 104, and the photoresist layer is thereafter stripped.

Also illustrated by the cross-sectional view 1400 of FIG. 14, a third lower pad layer 1302 and a third upper pad layer 1304 may be conformally deposited as a hard mask layer. The third lower pad layer 1302 may, for example, be formed of silicon nitride or some other suitable dielectric(s), and/or the third upper pad layer 1304 may, for example, be formed by silicon oxide or some other suitable dielectric(s).

As illustrated by the cross-sectional view 1500 of FIG. 15, a patterning process is performed to remove the third lower pad layer 1302, the third upper pad layer 1304, the second upper pad layer 804, and the second lower pad layer 802 from one or more selective logic sub-regions, the second logic sub-region $1041_2$ in this example. In some embodiments, a photo lithography process is performed with a photoresist layer 1402 covering the remaining regions of the workpiece. Then an etching process is performed to remove the third lower pad layer 1302, the third upper pad layer 1304, the second upper pad layer 804, and the second lower pad layer 802 from the second logic sub-region $1041_2$.

As illustrated by the cross-sectional view 1600 of FIG. 16, a second recessing process is performed, and the substrate 104 is recessed within the second logic sub-region $1041_2$ to a second recessed position. As a result, the substrate 104 has a second upper surface 182 in the second logic sub-region 1041$_2$. In some embodiments, with the remaining regions covered by the third lower pad layer 1302 and the third upper pad layer 1304, a second precursor layer 1502 is formed from an upper surface of the substrate 104, and thus reduces a height of the upper surface of the substrate 104 within the second logic sub-region 1041$_2$. In some embodiments, the second precursor layer 1502 is an oxide layer and formed by a wet oxidation process or a thermal process.

Figure 17:
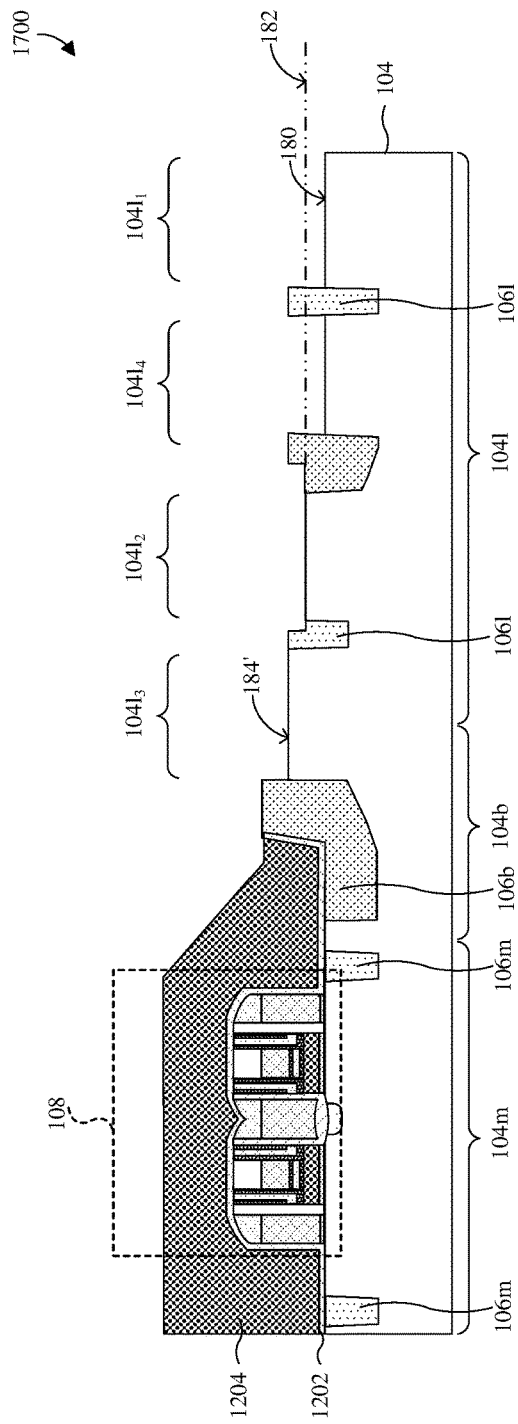

As illustrated by the cross-sectional view 1700 of FIG. 17, the second precursor layer 1502 (see FIG. 16) is subsequently removed, leaving the second upper surface 182 of the substrate 104 recessed from the first upper surface 184 of the substrate 104. The second precursor layer 1502 may be removed by a wet etching process. In some embodiments, the second upper pad layer 804, the second lower pad layer 802, the third lower pad layer 1302 and the third upper pad layer 1304 may all be removed by the same etching process of removing the second precursor layer 1502. As a result of the etching process, the first upper surface 180, and a third upper surface 184 of the substrate 104 are also exposed.

Figure 18:
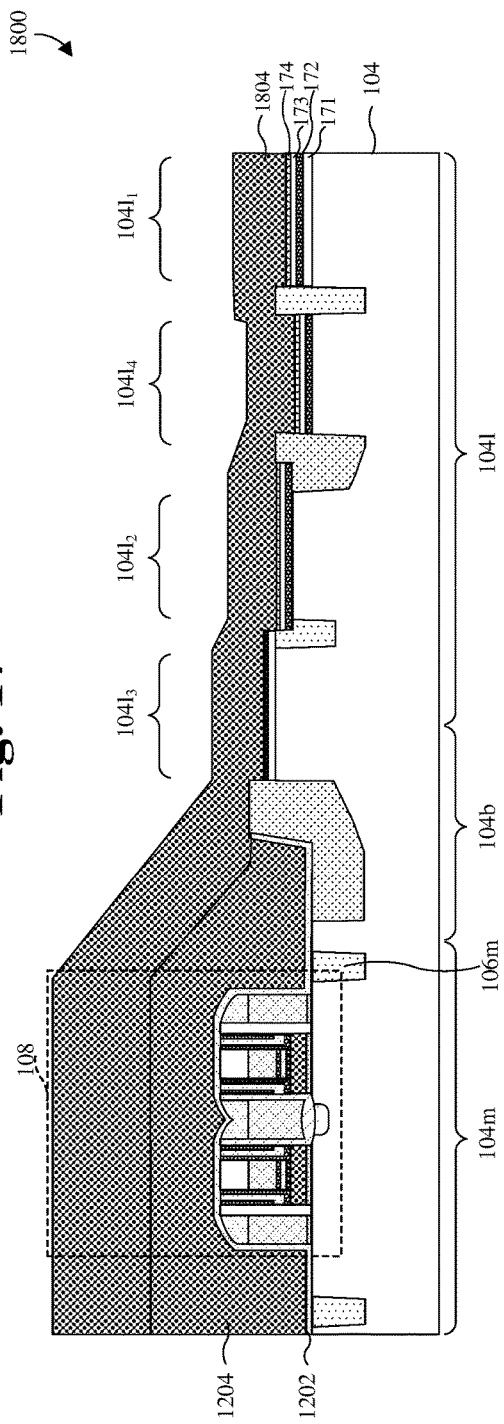

As illustrated by the cross-sectional view 1800 of FIG. 18, gate dielectric and gate electrode layers are formed on the logic region 1041.

As an example, a first gate dielectric precursor layer 171 is formed on the first logic sub-region 1041$_1$. The first gate dielectric precursor layer 171 may be deposited by a deposition process followed by a patterning process to remove the first gate dielectric precursor layer 171 from remaining regions other than the first logic sub-region 1041$_1$. Similarly, a second gate dielectric precursor layer 172 is formed on the first logic sub-region 1041$_1$, the second logic sub-region 1041$_2$, and the fourth logic sub-region 1041$_4$. The second gate dielectric precursor layer 172 may be formed directly on the first gate dielectric precursor layer 171 in the first logic sub-region 1041$_1$, and may be formed directly on the substrate 104 in the second logic sub-region 1041$_2$ and the fourth logic sub-region 1041$_4$. Similarly, a third gate dielectric precursor layer 173 is then formed and patterned. The third gate dielectric precursor layer 173 may be formed on the second gate dielectric precursor layer 172 in the first logic sub-region 1041$_1$, the second logic sub-region 1041$_2$, and the fourth logic sub-region 1041$_4$, and may be formed may be formed directly on the substrate 104 in the third logic sub-region 1041$_3$. As a result, gate dielectric stacks with different thicknesses are formed in the logic sub-regions 1041$_1$-1041$_4$.

The gate dielectric precursor layers 171-173 may be one or multiple layers of silicon dioxide, including but not limited to room temperature oxide (RTO) and/or high temperature oxide (HTO). The gate dielectric precursor layers 171-173 can also be formed by some other suitable dielectric material(s), and/or may, for example, be formed by in-situ steam generation (ISSG), chemical vapor deposition (CVD), physical vapor deposition (PVD), sputtering, or some other suitable deposition process(es). The patterning process may comprise dry etching and/or wet etching. It is understood that the disclosed method is not limited to forming and patterning the gate dielectrics the exact way as the above example, other approaches to form gate dielectrics with different thicknesses are amenable. Similar approaches can be used to process other regions of an integrated circuit.

Also illustrated by the cross-sectional view 1800 of FIG. 18, a high κ dielectric layer 174 may be formed on the third gate dielectric precursor layer 173 covering the logic region 1041. A logic gate layer 1804 is formed on the high κ dielectric layer 174.

Figure 19:
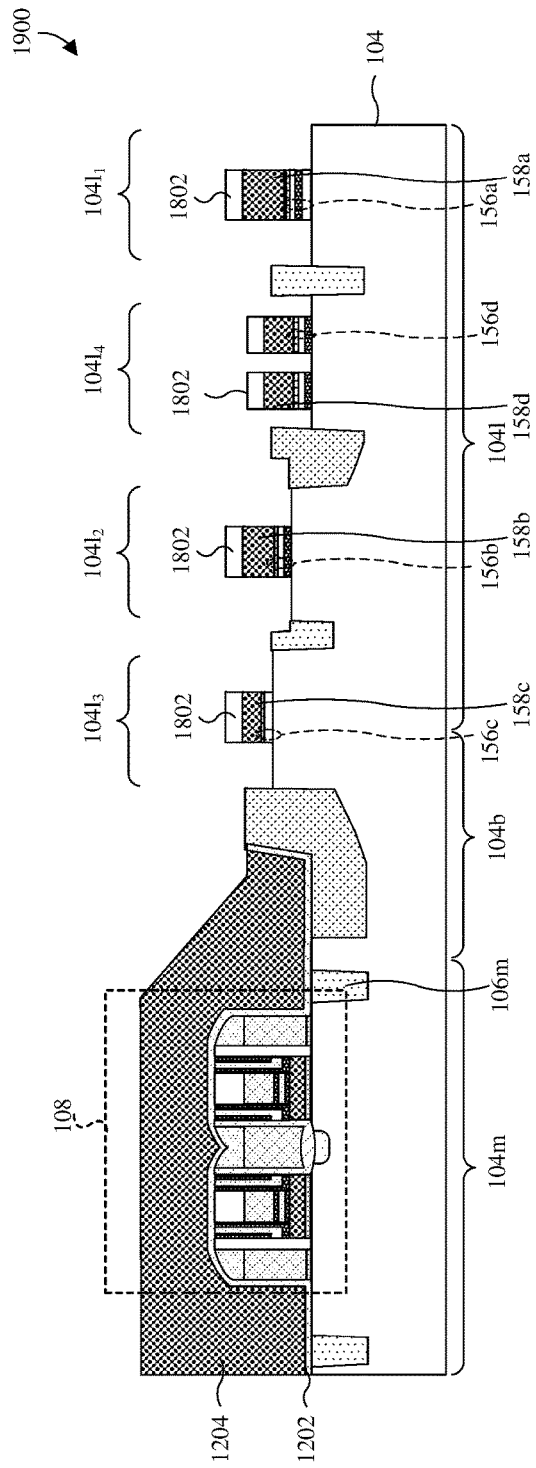

As illustrated by the cross-sectional view 1900 of FIG. 19, a series of etching processes are performed to the logic gate layer 1804 to form a plurality of logic gate electrodes 158a-158d overlying the logic region 1041. The plurality of logic gate electrodes 158a-158d may be formed according to a hard mask layer 1802 formed and patterned on the logic gate layer 1804. The logic gate dielectric precursor layers 171-173 are patterned according to the hard mask layer 1802 to form logic gate dielectrics 156a-156d underneath corresponding logic gate electrodes 158a-158d.

Figure 20:
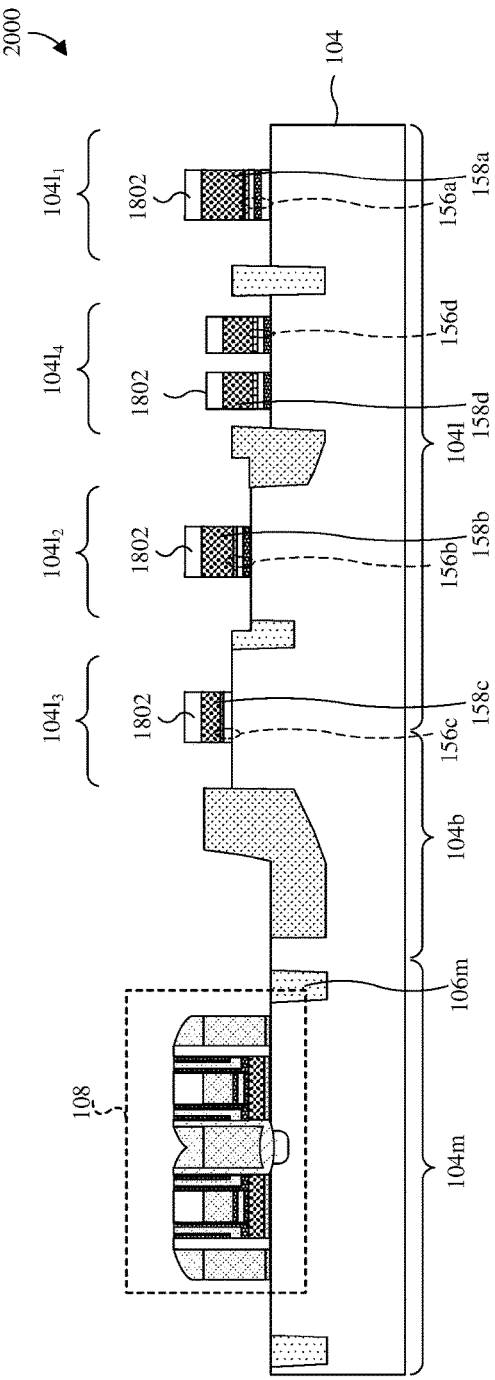

As illustrated by the cross-sectional view 2000 of FIG. 20, an etching process is performed to remove the dummy capping layer 1204 and the dummy liner layer 1202 (shown in FIG. 19) from the memory region 104m. The etching process may comprise a series of dry and/or wet etching processes. A masking layer (e.g., a photoresist layer, not shown) may be used to cover and protect the logic region 1041 from etching.

As illustrated by the cross-sectional view 2100 of FIG. 21, a main sidewall spacer 124 is formed along sidewalls of the logic gate electrodes 158a-158d at the logic region 1041 and along sidewalls of the memory cell structure 108 at the memory region 104m. In some embodiments, the main sidewall spacer 124 is made of silicon oxide, silicon nitride, some other suitable dielectric(s), or any combination of the foregoing. The main spacer layer may, for example, be deposited conformally, and/or may, for example, be formed by CVD, PVD, some other suitable deposition process(es), or any combination of the foregoing.

Also illustrated by the cross-sectional view 2100 of FIG. 21, a pair of memory source/drain regions 126 is formed within the memory region 104m, respectively bordering the memory cell structure 108. Also, logic source/drain regions 152 are formed in pairs within the logic region 1041, with the source/drain regions of each pair respectively bordering opposite sidewalls of the logic gate electrodes 158a-158d. In some embodiments, a process for forming the source/drain regions comprises ion implantation into the substrate 104. In other embodiments, some process other than ion implantation is used to form the source/drain regions. In some embodiments, a silicide pad is formed on the first logic gate electrode 158a. The silicide pad may be or otherwise comprise, for example, nickel silicide or some other suitable silicide(s), and/or may, for example, be formed by a salicide process or some other suitable growth process(es). Though not shown in the figure, silicide pads can also be formed on the memory source/drain regions 126 and the logic source/drain regions 152.

As illustrated by the cross-sectional view 2200 of FIG. 22, an etching process is performed to remove the hard masks 1802 (see FIG. 21), and the etching process may expose the corresponding logic gate electrodes 158a-158d. The etching process may also lower logic isolation structures 1061$_1$-1061$_3$.

As illustrated by the cross-sectional view 2300 of FIG. 23, a contact etch stop layer (CESL) 166 and a lower inter-layer dielectric (ILD) layer 1621 are formed covering the structure of FIG. 23. The lower ILD layer 1621 may, for example, be deposited by CVD, PVD, sputtering, or any combination of the foregoing. The lower ILD layer 1621 may, for example, be oxide, low κ dielectric, some other suitable dielectric(s), or any combination of the foregoing.

As illustrated by the cross-sectional view 2400 of FIG. 24, a planarization process is performed to the lower inter-layer dielectric (ILD) layer 1621 and the contact etch stop layer (CESL) 166. The planarization process may be, for example, a CMP or some other suitable planarization process(es). The planarization process may also recess a top surface of the lower ILD layer 1621 to about even with top surfaces of at least some of the logic gate electrodes 158a-158d, thereby exposing the logic gate electrodes 158a-158d. In some embodiments, the planarization process may cause a dishing effect in sub-regions that have devices with greater density or greater dimensions. The fourth logic sub-regions 1041$_4$ is shown as an example of such sub-regions. A top surface of the fourth logic gate electrodes 158d is lowered to a position lower than the top surface of the lower inter-layer dielectric (ILD) layer 1621. Since a fourth logic gate dielectric 156d and the fourth logic gate electrode 158d are positioned in a relative low position, the first upper surface 180 in this example, the fourth logic gate electrode 158d is protected and maintained a sufficient height for its function. The fourth logic gate dielectric 156d may have a thickness substantially equal to that of another logic gate dielectric positioned at a relative higher position. The fourth logic gate dielectric 156d may also have a thickness smaller than that of another logic gate dielectric positioned at the same position. In the example, the fourth logic gate dielectric 156d may have a thickness substantially equal to a second logic gate dielectric 156b positioned on a second upper surface 182 in the second logic sub-region 1041$_2$, which is smaller than a thickness of a first logic gate dielectric 156a in the first logic sub-region 1041$_1$.

Figure 25:
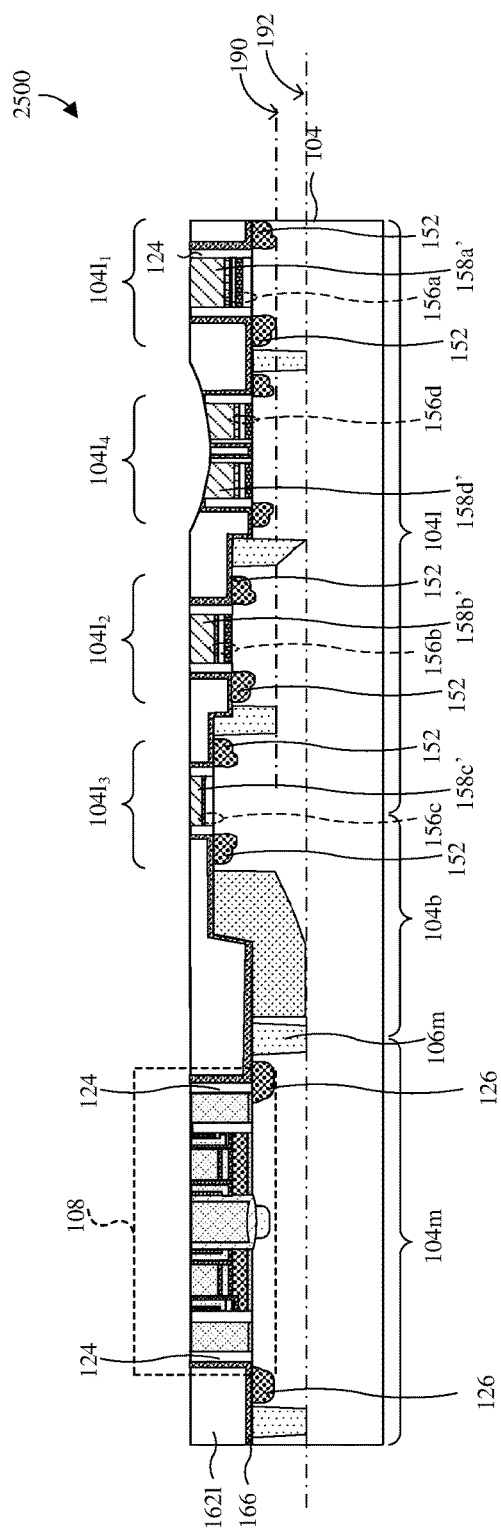

As illustrated by the cross-sectional view 2500 of FIG. 25, in some embodiments, a replacement gate process is then performed. An etching process is firstly performed to remove the logic gate electrodes 158a-158d (referring to FIG. 24). A plurality of metal gate electrodes 158a'-158d' is then formed in place of the logic gate electrodes 158a-158d. The metal gate electrodes 158a'-158d' may, for example, be metal, a different material than the logic gate electrodes 158a-158d, or some other suitable conductive material(s). In some embodiments, a process for forming the metal gate electrodes 158a'-158d' comprises forming a conductive layer by, for example, CVD, PVD, electroless plating, electroplating, or some other suitable growth or deposition process(es). A planarization is then performed into the conductive layer until the lower ILD layer 1621 is reached. The planarization may, for example, be performed by a CMP or some other suitable planarization process(es).

Figure 26:
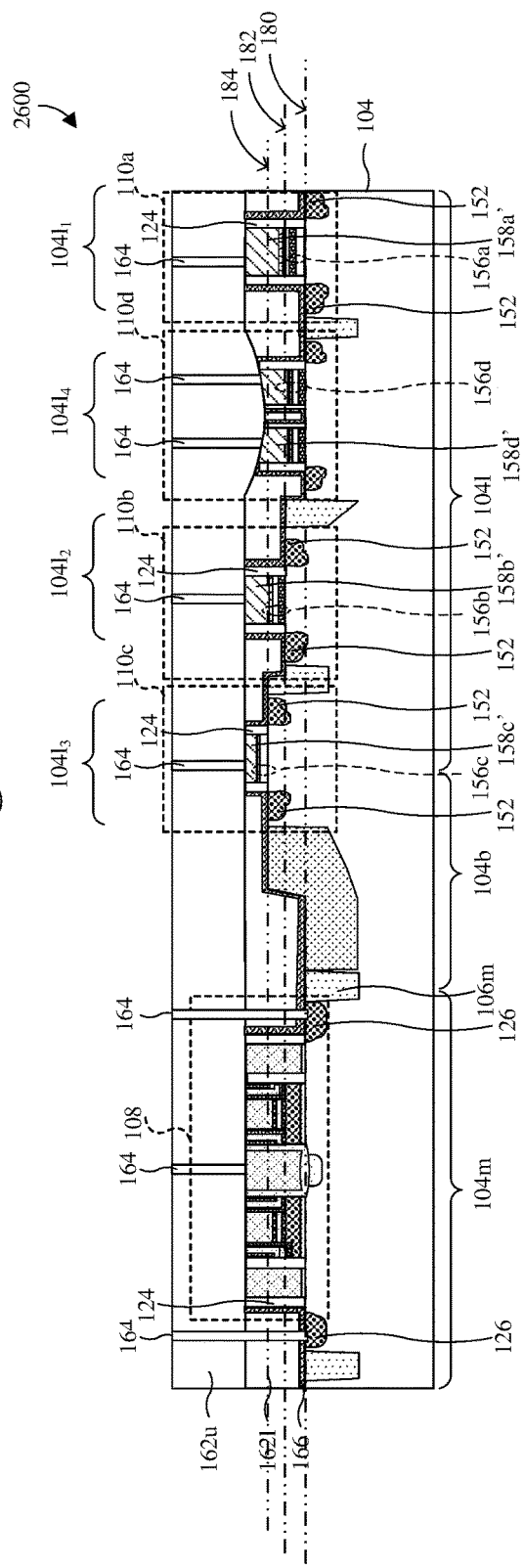

As illustrated by the cross-sectional view 2600 of FIG. 26, an upper ILD layer 162u is formed covering the structure of FIG. 25 and with a top surface that is planar or substantially planar. The upper ILD layer 162u may, for example, be oxide, a low κ dielectric, some other suitable dielectric(s), or any combination of the foregoing. Further, the upper ILD layer 162u may, for example, be formed by depositing the upper ILD layer 162u, and subsequently performing a planarization into the top surface of the upper ILD layer 162u. The deposition may, for example, be performed by CVD, PVD, sputtering, or any combination of the foregoing. The planarization may, for example, be performed by a CMP or some other suitable planarization process(es). Also illustrated by the cross-sectional view 2600 of FIG. 26, contact vias 164 are formed extending through the upper ILD layer 162u and the lower ILD layer 1621 to the memory source/drain regions 126 and the logic source/drain regions 152. The contact vias 164 may also be formed coupled to the control gate electrodes 138, the select gate electrodes 150, the metal gate electrodes 158a'-158d', or any combination of the foregoing.

Figure 27:
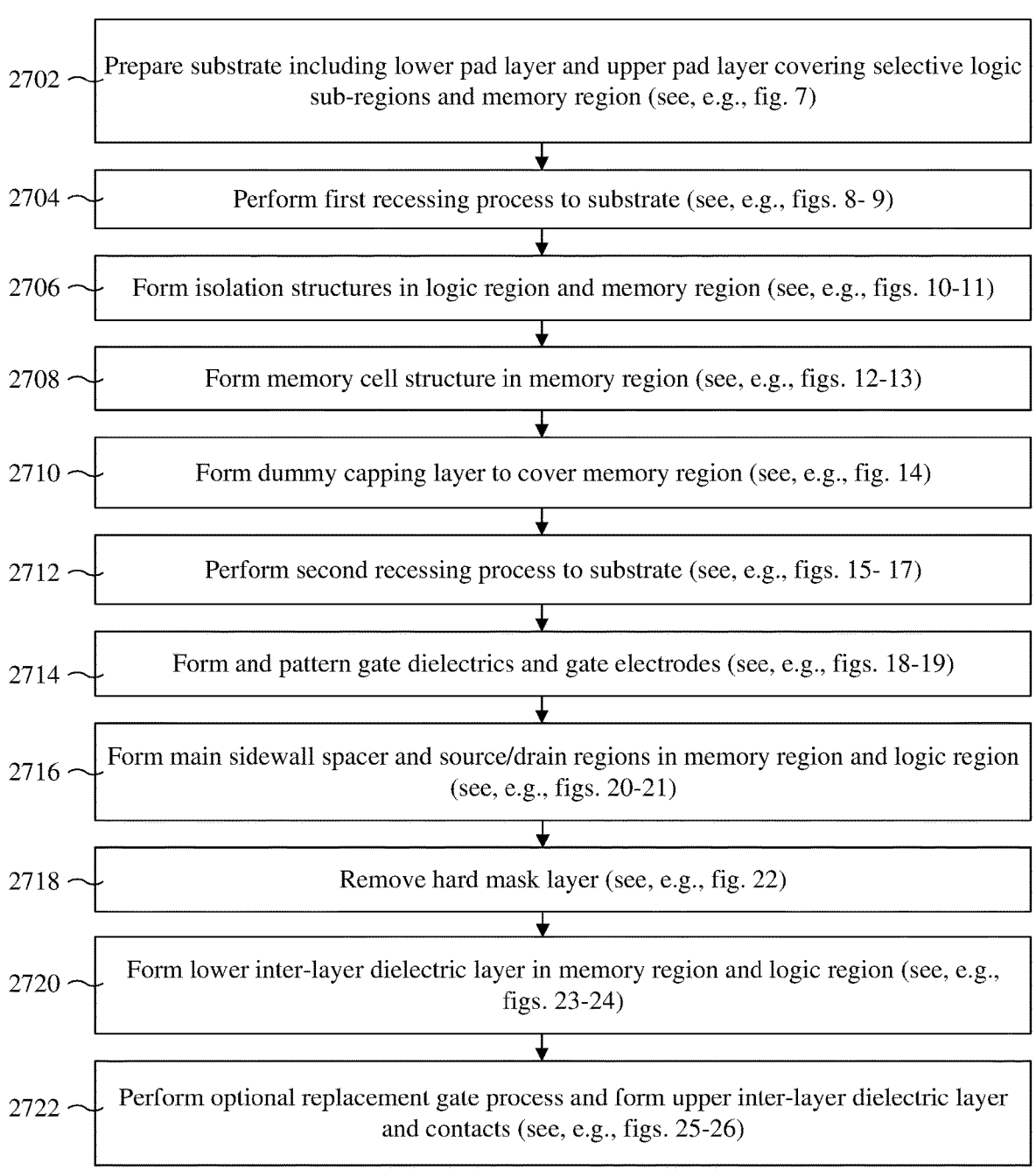
FIG. 27 illustrates a flowchart of some embodiments of the method of FIGS. 7-26.

With reference to FIG. 27, a flowchart 2700 of some embodiments of a method for forming an IC comprising a plurality of logic devices operating at different voltages is provided. The IC may, for example, correspond to the IC of FIGS. 7-26.

At 2702, a substrate is provided. The substrate includes a memory region and a logic region connected by a boundary region. In some embodiments, a lower pad layer and an upper pad layer are formed covering the logic region, and the lower pad layer and the upper pad layers are patterned to expose the memory region and some selective logic sub-regions. See, for example, FIG. 7.

At 2704, a first recessing process is performed to the substrate. In the memory region and the selective logic sub-regions, a top surface of the substrate may be etched to form a first upper surface locating at a first recessed position lower than the top surface. The first recessing process may be performed by performing an oxidation process to convert an upper portion of the substrate to a silicon dioxide layer. Then an etching process is performed remove the silicon dioxide layer and expose the first upper surface of the substrate. As a result, the selective logic sub-regions have a top surface locating at the same level with that of the memory region. See, for example, FIGS. 8-9.

At 2706, dielectric isolation structures are formed in the logic region and the memory region. In some embodiments, the dielectric isolation structures are formed after the first recessing process. Bottom surfaces of the dielectric isolation structures may locate at a first depth of the substrate in the memory region and the selective logic sub-regions deeper than a second depth of the substrate where bottom surfaces of the dielectric isolation structures may locate in other logic sub-regions. See, for example, FIGS. 10-11.

At 2708, a memory cell structure is formed within the memory region. See, for example, FIGS. 12-13.

At 2710, a dummy capping layer is formed covering the memory cell structure at the memory region. See, for example, FIG. 14.

At 2712, a second recessing process is performed to some selective logic sub-regions the substrate. In some embodiments, the selective logic sub-regions have a top surface being the top surface of the whole substrate before the second recessing process, i.e., not the selective logic sub-regions of the first recessing process. The top surface of the substrate may be etched to form a second upper surface locating at a second recessed position lower than the top surface but higher than the first recessed position. Similar as the first recessing process, the second recessing process may be performed by performing an oxidation process to convert an upper portion of the substrate to a silicon dioxide layer. Then an etching process is performed remove the silicon dioxide layer and expose the second upper surface of the substrate. As a result, the selective logic sub-regions have a top surface locating at a second upper surface locating between the first recessed position and the top surface of the substrate. See, for example, FIGS. 15-17.

In some alternative embodiments, the second recessing process may be performed in some logic sub-regions overlapped with those of the first recessing process. In the logic sub-regions overlapped with those of the first recessing process, the resulting upper surface may locate at a position deeper than the first recessed position in the substrate. In other logic sub-regions not overlapped with those of the first recessing process, the resulting upper surface may locate at a position shallower than the first recessed position in the substrate. Also in some alternative embodiments, upper surfaces with different levels are designed and formed for logic devices with same thickness and/or same operation voltage when the logic devices have different density or lateral dimensions. Thus, the effect of dishing effect or erosion can be offset by the different heights of the substrate.

By forming upper surfaces of the substrate locating at multiple levels, the later formed logic devices can be arranged at different heights, and thus providing more design flexibilities.

At 2714, gate dielectrics and gate electrodes are patterned and formed in the logic region. See, for example, FIGS. 18-19.

At 2716, main sidewall spacer and source/drain regions are formed in the memory region and the logic region. See, for example, FIGS. 20-21.

At 2718, the hard mask layer is removed. See, for example, FIG. 22.

At 2720, a lower inter-layer dielectric layer is formed filling spaces between the memory device structures at the memory region, and is further formed filling spaces between the logic devices at the logic region. See, for example, FIGS. 23-24.

At 2722, an optional replacement gate process may be performed to replace the logic gate electrodes with metal gate electrodes for the logic devices at the logic region. An upper inter-layer dielectric layer is formed on the lower inter-layer dielectric layer, the memory device structures, and the logic devices at the memory and logic regions. Contacts can be subsequently formed. See, for example, FIGS. 25-26.

While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards an integrated circuit (IC). The IC includes a memory region, a logic region, and a boundary region between the memory region and the logic region integrated in a substrate. A memory cell structure is disposed on the memory region. A plurality of logic devices is disposed on a plurality of logic sub-regions of the logic region. A first logic device is disposed on a first upper surface of a first logic sub-region and configured to operate at a first voltage and comprising a first logic gate electrode separated from the substrate by a first logic gate dielectric. A second logic device is disposed on a second upper surface of a second logic sub-region and configured to operate at a second voltage and comprising a second logic gate electrode separated from the substrate by a second logic gate dielectric. A third logic device is disposed on a third upper surface of a third logic sub-region and configured to operate at a third voltage and comprising a third logic gate electrode separated from the substrate by a third logic gate dielectric. The first, second, and third voltages monotonically decrease, and wherein thicknesses of the first, second, and third logic gate dielectrics monotonically decrease. Heights of the first, second, and third upper surfaces of the logic sub-regions monotonically decrease.

Further, some embodiments of the present application are directed towards a method of forming an integrated circuit (IC). In the method, a substrate is provided including a memory region and a logic region adjacent to the memory region. The logic region has a plurality of logic sub-regions. A first masking layer is formed and patterned to expose a first logic sub-region and the memory region and to cover a second logic sub-region and a third logic sub-region. The first logic sub-region has a first logic device configured to operate at a first voltage, the second logic sub-region has a second logic device configured to operate at a second voltage, and the third logic sub-region has a third logic device configured to operate at a third voltage. A first recessing process is performed to lower top surfaces of the first logic sub-region and the memory region to a first recess position below a top surface of the substrate. A memory cell structure is formed on the memory region of the substrate. A second recessing process is performed to lower a top surface of the second logic sub-region to a second recess position below the top surface of the substrate.

Further, some embodiments of the present application are directed towards an integrated circuit (IC). The IC comprises a memory region and a logic region integrated in a substrate and connected by a boundary region. A memory cell structure is disposed on the memory region. A plurality of logic devices is disposed on a plurality of logic sub-regions of the logic region. A first logic device is disposed on a first upper surface of a first logic sub-region, a second logic device is disposed on a second upper surface of a second logic sub-region, and a third logic device is disposed on a third upper surface of a third logic sub-region. The first upper surface locates at a position lower than the second upper surface and further lower than the third upper surface that is coplanar with a top surface of the memory region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a memory region, a logic region, and a boundary region between the memory region and the logic region integrated in a substrate;
   a memory cell structure disposed on the memory region; and
   a plurality of logic devices disposed on a plurality of logic sub-regions of the logic region, including:
      a first logic device disposed on a first upper surface of a first logic sub-region and configured to operate at a first voltage and comprising a first logic gate electrode separated from the substrate by a first logic gate dielectric;
      a second logic device disposed on a second upper surface of a second logic sub-region and configured to operate at a second voltage and comprising a second logic gate electrode separated from the substrate by a second logic gate dielectric; and
      a third logic device disposed on a third upper surface of a third logic sub-region and configured to operate at a third voltage and comprising a third logic gate electrode separated from the substrate by a third logic gate dielectric;

wherein the first, second, and third voltages monotonically decrease, and wherein thicknesses of the first, second, and third logic gate dielectrics monotonically decrease;
wherein heights of the first, second, and third upper surfaces of the logic sub-regions monotonically increase.

2. The IC according to claim 1, wherein the first upper surface of the first logic sub-region is coplanar with a top surface of the memory region.

3. The IC according to claim 1, further comprising:
a fourth logic device disposed on a fourth upper surface of a fourth logic sub-region and configured to operate at a fourth voltage and comprising a fourth logic gate electrode separated from the substrate by a fourth logic gate dielectric;
wherein the fourth logic gate dielectric has the same thickness with the second logic gate dielectric; and
wherein the fourth upper surface of the substrate has the same height with the first upper surface of the first logic sub-region.

4. The IC according to claim 3, wherein the fourth logic sub-region has a device density greater than that of the second logic sub-region.

5. The IC according to claim 3,
wherein the first, second, and third logic gate electrodes have top surfaces aligned with each other, and higher than a top surface of the fourth logic gate electrode.

6. The IC according to claim 1, wherein the memory cell structure comprises a pair of control gate electrodes respectively disposed over the substrate and a pair of select gate electrodes disposed on opposite sides of the pair of control gate electrodes.

7. The IC according to claim 6,
wherein the first, second, and third logic gate electrodes comprise metal;
wherein the pair of control gate electrodes and the pair of select gate electrodes comprise polysilicon.

8. An integrated circuit (IC) comprising:
a memory region and a logic region integrated in a substrate and connected by a boundary region;
a memory cell structure disposed on the memory region; and
a plurality of logic devices disposed on a plurality of logic sub-regions of the logic region, wherein a first logic device is disposed on a first upper surface of a first logic sub-region, a second logic device is disposed on a second upper surface of a second logic sub-region, and a third logic device is disposed on a third upper surface of a third logic sub-region;
wherein the first upper surface is located at a position lower than the second upper surface and further lower than the third upper surface, and the first upper surface is coplanar with a top surface of the memory region.

9. The IC according to claim 8, wherein the first upper surface of the first logic sub-region is coplanar with a top surface of the memory region.

10. The IC according to claim 8, further comprising:
a fourth logic device disposed on a fourth upper surface of a fourth logic sub-region and configured to operate at a fourth voltage and comprising a fourth logic gate electrode separated from the substrate by a fourth logic gate dielectric;
wherein the fourth logic gate dielectric has the same thickness with a second logic gate dielectric of the second logic device; and
wherein the fourth upper surface of the substrate has the same height with the first upper surface of the first logic sub-region.

11. The IC according to claim 10,
wherein the first, second, and third logic devices have respective gate electrodes that have top surfaces level with each other, and higher than a top surface of the fourth logic gate electrode.

12. The IC according to claim 8, wherein the first, second, and third logic devices have respective voltages that monotonically decrease, and wherein heights of the first, second, and third upper surfaces of the logic sub-regions monotonically decrease.

13. The IC according to claim 8, wherein the memory cell structure comprises a pair of control gate electrodes respectively disposed over the substrate and a pair of select gate electrodes disposed on opposite sides of the pair of control gate electrodes.

14. The IC according to claim 13,
wherein a gate electrode of the first, second, or third logic device comprises metal;
wherein the pair of control gate electrodes and the pair of select gate electrodes comprise polysilicon.

15. An integrated circuit (IC) comprising:
a memory region and a logic region integrated in a substrate and connected by a boundary region;
a memory cell structure disposed on the memory region; and
a plurality of logic devices disposed on a plurality of logic sub-regions of the logic region, wherein a first logic device includes a first gate electrode disposed over a first upper surface of a first logic sub-region, a second logic device includes a second gate electrode disposed over a second upper surface of a second logic sub-region, and a third logic device includes a third gate electrode disposed over a third upper surface of a third logic sub-region;
wherein the third upper surface is located at a position higher than the second upper surface and further higher than the first upper surface; and
wherein at least two of the first gate electrode, the second gate electrode, and the third gate electrode have upper surfaces that are co-planar with one another;
wherein the first logic device is configured to operate at a first voltage; the second logic device is configured to operate at a second voltage; and the third logic device is configured to operate at a third voltage, wherein the first, second, and third voltages monotonically decrease.

16. The IC according to claim 15, wherein the third upper surface of the third logic sub-region is coplanar with a top surface of the memory region.

17. The IC according to claim 15, wherein the first logic device comprises a first logic gate electrode separated from the substrate by a first logic gate dielectric; the second logic device comprises a second logic gate electrode separated from the substrate by a second logic gate dielectric; and the third logic device comprises a third logic gate electrode separated from the substrate by a third logic gate dielectric.

18. The IC according to claim 17, wherein thicknesses of the first, second, and third logic gate dielectrics monotonically decrease, and wherein heights of the first, second, and third upper surfaces of the logic sub-regions monotonically increase.

19. The IC according to claim 15, further comprising:
a fourth logic device disposed on a fourth upper surface of a fourth logic sub-region and comprising a fourth logic gate electrode separated from the substrate by a fourth logic gate dielectric;

wherein the fourth logic gate dielectric has the same thickness with a second logic gate dielectric of the second logic device; and wherein the fourth upper surface of the substrate has the same height with the first upper surface of the first logic sub-region.

20. The IC according to claim 19, wherein the upper surfaces of each of the first gate electrode, the second gate electrode, and the third gate electrode lie along a plane, and an upper surface of the fourth logic gate electrode is below the plane.

* * * * *